US006074802A

United States Patent [19]

Murata et al.

[11] Patent Number: 6,074,802

[45] Date of Patent: Jun. 13, 2000

[54] POSITIVE PHOTOSENSITIVE COMPOSITION, POSITIVE PHOTOSENSITIVE LITHOGRAPHIC PRINTING PLATE AND METHOD FOR ITS TREATMENT

[75] Inventors: Akihisa Murata; Hideki Nagasaka, both of Yokohama, Japan

[73] Assignee: Mitsubishi Chemical Corporation, Tokyo, Japan

[21] Appl. No.: 09/179,899

[22] Filed: Oct. 28, 1998

[30] Foreign Application Priority Data

Oct. 28, 1997 [JP] Japan .................................... 9-295339

[51] Int. Cl.[7] ...................................................... G03F 7/004

[52] U.S. Cl. .................................... 430/270.1; 430/288.1; 430/302

[58] Field of Search .............................. 430/270.1, 288.1, 430/302

[56] References Cited

U.S. PATENT DOCUMENTS

| | | | |
|---|---|---|---|
| 4,708,925 | 11/1987 | Newman | 430/270 |
| 5,340,699 | 8/1994 | Haley et al. . | |
| 5,663,037 | 9/1997 | Haley et al. . | |
| 5,814,431 | 9/1998 | Nagasaka et al. . | |

FOREIGN PATENT DOCUMENTS

| | | |
|---|---|---|
| 0 784 233 A1 | 7/1997 | European Pat. Off. . |
| 9-43847 | 2/1997 | Japan . |
| 1 489 308 | 10/1977 | United Kingdom . |
| WO 97/39894 | 10/1997 | WIPO . |

*Primary Examiner*—Janet Baxter
*Assistant Examiner*—Barbara Gilmore
*Attorney, Agent, or Firm*—Oblon, Spivak, McClelland, Maier & Neustadt, P.C.

[57] ABSTRACT

A positive photosensitive composition comprising at least (a) an alkali-soluble resin and (b) a photo-thermal conversion material, which further contains (c) a compound capable of crosslinking the alkali-soluble resin by a thermal action, and which contains substantially no compound which has a function to generate an acid when exposed in the coexistence of the photo-thermal conversion material.

21 Claims, No Drawings

POSITIVE PHOTOSENSITIVE COMPOSITION, POSITIVE PHOTOSENSITIVE LITHOGRAPHIC PRINTING PLATE AND METHOD FOR ITS TREATMENT

The present invention relates to a novel positive photosensitive composition useful as sensitive to a light ray in a near infrared wavelength region. Particularly, it relates to a positive photosensitive composition suitable for direct plate making by means of a semiconductor laser or a YAG laser and a positive photosensitive lithographic printing plate.

Along with the progress in the image treating technology by computers, an attention has been drawn to a photosensitive or heat sensitive direct plate making system wherein a resist image is formed directly from digital image information by a laser beam or a thermal head without using a silver salt masking film.

Especially, it has been strongly desired to realize a high resolution laser photosensitive direct plate making system employing a high power semiconductor laser or YAG laser, from the viewpoint of downsizing, the environmental light during the plate making operation and plate material costs.

On the other hand, as image-forming methods wherein laser photosensitivity or heat sensitivity is utilized, there have heretofore been known a method of forming a color image by means of a sublimable transfer dye and a method of preparing a lithographic printing plate.

In recent years, a technique in which a chemical amplification type photoresist is combined with a long wavelength light ray absorbing dye, has been proposed. For example, JP-A-6-43633 discloses a photosensitive material wherein a certain specific squarilium dye is combined with a photo-acid-generator and a binder.

Further, as a technique of this type, a technique for preparing a lithographic printing plate by exposing a photosensitive layer containing an infrared ray absorbing dye, a latent Brønsted acid, a resol resin and a novolak resin, in an image pattern by e.g. a semiconductor laser, has been proposed (JP-A-7-20629). Further, the same technique wherein a s-triazine compound is used instead of the above latent Brønsted acid, has also been proposed (JP-A-7-271029).

Further, JP-A-9-43847 discloses a resist material capable of changing the crystallinity of photosensitive material by heating by irradiation with infrared light rays, and a method for forming a pattern utilizing it.

Further, EP784233 discloses a negative chemical amplification type photosensitive composition comprising (a) a resin selected from novolak and a polyvinylphenol, (b) an amino compound derivative capable of crosslinking the resin, (c) an infrared light-absorbing agent having a specific structure, and (d) a photo-acid-generator.

However, the performance of such conventional techniques was practically inadequate. For example, in a case of a negative photosensitive material which requires heat treatment after exposure, it is considered that an acid generated from the exposure acts as a catalyst, and that the crosslinking reaction proceeds during the heat treatment, to form a negative image. However, in such a case, the stability of the image quality was not necessarily satisfactory, due to variation of the treating conditions. On the other hand, in a case of a positive photosensitive material which does not require such heat treatment after exposure, the contrast between an exposed portion and a non-exposed portion was inadequate. Consequently, the non-image portion was not sufficiently removed, or the film-remaining ratio at the image portion was not sufficiently maintained. Further, the printing resistance was not necessarily adequate. The lithographic printing plate disclosed in above JP-A-7-20629 is described to be useful as either a negative or positive plate. It is described that to use it as a positive plate, the exposed region is made alkali-soluble by image-pattern exposure and contacted with an aqueous alkali developer to remove the exposed region, and that in a case of a negative plate, the solubility of the exposed region is decreased by heating after image-pattern exposure followed by treatment with an aqueous alkali developer to remove the non-exposed region. However, Examples disclose only a case in which the heat treatment is carried out after the exposure, i.e. a negative plate, and no Example is given for a positive plate, not to mention about an improvement in printing resistance of a positive plate.

The present invention has been made in view of the above-mentioned various problems of the prior art. Namely, it is an object of the present invention to provide a positive photosensitive composition, which is excellent in the contrast as between an exposed portion and a non-exposed portion and which provides an adequate film-remaining ratio and excellent fastness at the image portion, and a positive photosensitive lithographic printing plate which is excellent in printing resistance and a method for its treatment.

Another object of the present invention is to provide a positive photosensitive lithographic printing plate which does not require heating before development after exposure, and thus is excellent in the stability of the image quality and a method for its treatment.

The present invention provides a positive photosensitive composition comprising at least (a) an alkali-soluble resin and (b) a photo-thermal conversion material, which further contains (c) a compound capable of crosslinking the alkali-soluble resin by a thermal action, and which contains substantially no compound which has a function to generate an acid when exposed in the coexistence of the photo-thermal conversion material, and a positive photosensitive lithographic printing plate which comprises a support and a photosensitive layer made of the positive photosensitive composition formed thereon.

Further, the present invention provides a positive photosensitive composition, comprising at least (a) an alkali-soluble resin and (b) a photo-thermal conversion material, which further contains (c) a compound capable of crosslinking the alkali-soluble resin by a thermal action, and which contains substantially no compound which is capable of generating an acid by a sensitizing effect of the photo-thermal conversion material, and a positive photosensitive lithographic printing plate which comprises a support and a photosensitive layer made of the positive photosensitive composition formed thereon.

Still further, the present invention provides a method for treatment of a positive photosensitive lithographic printing plate wherein the positive photosensitive printing plate is developed without a heat treatment after the exposure.

Now, the present invention will be described in detail with reference to the preferred embodiments.

The positive image forming mechanism of the positive photosensitive composition of the present invention is not clearly understood. However, by irradiation of a near infrared light ray, an alkali-easy-solubilizing phenomenon of an exposed portion is brought about, which is considered to be mainly due to a conformation change in the portion of an alkali-soluble resin irradiated with near infrared light rays, with substantially no chemical change, and such a phenomenon is utilized. Accordingly, the positive photosensitive composition of the present invention requires at least (a) an alkali-soluble resin and (b) a photo-thermal conversion material as essential components, and such components are contained in the positive photosensitive composition as essential components which bring about a difference in solubility in an alkali developer as between an exposed portion and a non-exposed portion, mainly by a change other than a chemical change.

In the present invention, such a composition contains a compound capable of crosslinking an alkali-soluble resin by a thermal action, whereby a coating film which is excellent in the fastness can be obtained, particularly by heating after exposure, and a substantial improvement in printing resistance can be obtained when it is used for a printing plate.

Now, the constituting components of the present invention will be described in detail.

As the alkali-soluble resin component (a) of the photosensitive composition to be used in the photosensitive composition of the present invention, a novolak resin or a polyvinylphenol resin can be suitably used.

The novolak resin may be one prepared by polycondensing at least one member selected from aromatic hydrocarbons such as phenol, m-cresol, o-cresol, p-cresol, 2,5-xylenol, 3,5-xylenol, resorcinol, pyrogallol, bisphenol, bisphenol-A, trisphenol, o-ethylphenol, m-ethylphenyl, p-ethylphenol, propylphenol, n-butylphenol, t-butylphenol, 1-naphthol and 2-naphthol, with at least one aldehyde or ketone selected from aldehydes such as formaldehyde, acetaldehyde, propionaldehyde, benzaldehyde and furfural and ketones such as acetone, methyl ethyl ketone and methyl isobutyl ketone, in the presence of an acid catalyst. Instead of the formaldehyde and acetaldehyde, paraformaldehyde and paraldehyde may, respectively, be used. The weight average molecular weight calculated as polystyrene, measured by gel permeation chromatography (hereinafter referred to simply as GPC), of the novolak resin (the weight average molecular weight by the GPC measurement will hereinafter be referred to as Mw) is preferably from 1,000 to 15,000, more preferably from 1,500 to 10,000.

The aromatic hydrocarbon of a novolak resin may, for example, be preferably a novolak resin obtained by polycondensing at least one phenol selected from phenol, o-cresol, m-cresol, p-cresol, 2,5-xylenol, 3,5-xylenol and resorcinol, with at least one member selected from aldehydes such as formaldehyde, acetaldehyde or propionaidehyde.

Among them, preferred is a novolak resin which is a polycondensation product of an aldehyde with a phenol comprising m-cresol/p-cresol/2,5-xylenol/3, 5-xylenol/resorcinol in a mixing molar ratio of 70 to 100/0 to 30/0 to 20/0 to 20/0 to 20, or with a phenol comprising phenol/m-cresol/p-cresol in a mixing molar ratio of 10 to 100/0 to 60/0 to 40. Among aldehydes, formaldehyde is particularly preferred.

The polyvinyl phenol resin may be a polymer of one or more hydroxystyrenes such as o-hydroxystyrene, m-hydroxystyrene, p-hydroxystyrene, 2-(o-hydroxyphenyl) propylene, 2-(m-hydroxyphenyl)propylene or 2-(p-hydroxyphenyl)propylene. Such a hydroxystyrene may have a substituent such as a halogen such as chlorine, bromine, iodine or fluorine, or a $C_{1-4}$ alkyl group, on its aromatic ring. Accordingly, the polyvinyl phenol may be a polyvinyl phenol which may have a halogen or a $C_{1-4}$ alkyl substituent in its aromatic ring.

The polyvinyl phenol resin is usually prepared by polymerizing one or more hydroxystyrenes which may have substituents in the presence of a radical polymerization initiator or a cationic polymerization initiator. Such a polyvinyl phenol resin may be the one subjected to partial hydrogenation.

Or, it may be a resin having a part of OH groups of a polyvinyl phenol protected by e.g. t-butoxycarbonyl groups, pyranyl group, or furanyl groups. Mw of the polyvinyl phenol resin is preferably from 1,000 to 100,000, more preferably from 1,500 to 50,000.

More preferably, the polyvinyl phenol resin is a polyvinyl phenol which may have a $C_{1-4}$ alkyl substituent in its aromatic ring, particularly preferably an unsubstituted polyvinyl phenol.

If Mw of the above novolak resin or polyvinyl phenol resin is smaller than the above range, an adequate coating film as a resist can not be obtained, and if it exceeds the above range, the solubility of the non-exposed portion in an alkali developer tends to be small, whereby a pattern of a resist tends to be hardly obtainable.

Among the above described resins, a novolak resin is particularly preferred. The ratio of such a resin to be used in the present invention is usually from 40 to 95 wt %, more preferably from 60 to 90 wt %, based on the total solid content of the photosensitive composition.

The photo-thermal conversion material (b) to be used for the positive photosensitive composition of the present invention is not particularly limited as long as it is a material capable of generating heat when irradiated with light. More specifically, it may, for example, be a compound having an absorption band covering a part or whole of a wavelength region of from 650 to 1,300 nm, such as an organic or inorganic pigment, an organic dye, or a metal. Specifically, it may, for example, be carbon black, graphite, a metal such as titanium or chromium, a metallic oxide such as titanium oxide, tin oxide, zinc oxide, vanadium oxide or tungsten oxide, a metal carbide such as titanium carbide, a metal boride, or an inorganic black pigment, an azo type black pigment, "Lionol Green 2YS", or a black or green organic pigment such as "Green Pigment 7", as disclosed in JP-A-4-322219. The above carbon black may, for example, be "MA-7", "MA-100", "MA-220", "#5", "#10" or "#40", as a commercial product of Mitsubishi Chemical Corporation, or "Color Black FW2", "FFW20" or "Printex V", as a commercial product of Degussa Company.

Further, dyes having absorption in a near infrared region, as disclosed in e.g. "Special Function Dye" (compiled by Ikemori and Hashiratani, 1986, published by Kabushiki Kaisha CMC), "Chemistry of Functional Dyes" (compiled by Higaki, 1981, published by Kabushiki Kaisha CMC), "Dye Handbook" (compiled by Oga, Hirashima, Matsuoka and Kitao, published by Kodansha), the catalogue published in 1995 by Japan Photosensitive Research Institute, and a laser dye catalogue published in 1989 by Exciton Inc., may be mentioned.

Further, organic dyes disclosed in JP-A-2-2074, JP-A-2-2075, JP-A-2-2076, JP-A-3-97590, JP-A-3-97591, JP-A-3-63185, JP-A=3-26593 and JP-A-3-97589, and commercial product "IR820B" of Nippon Kayaku K.K., may, for example, be mentioned. As the photo-thermal conversion material, typical examples of dyes and pigments having absorption in a near infrared region will be shown below.

S-1
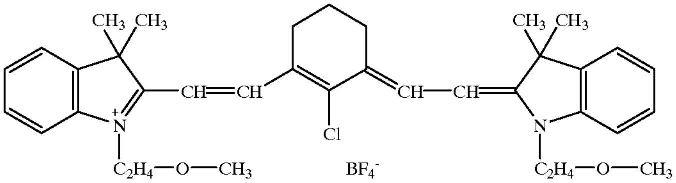
S-2
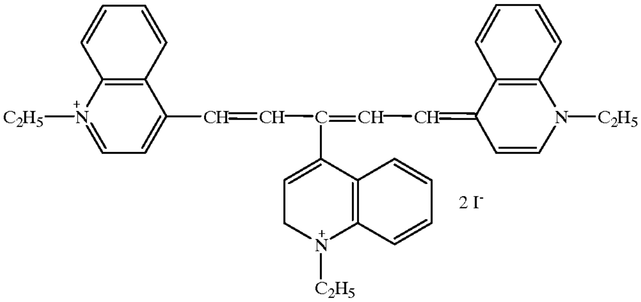
S-3
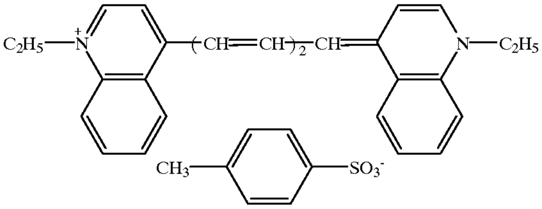
S-4
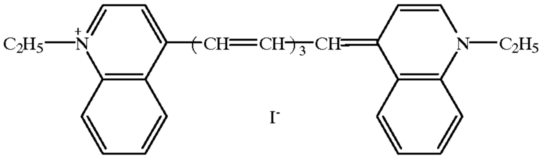
S-5
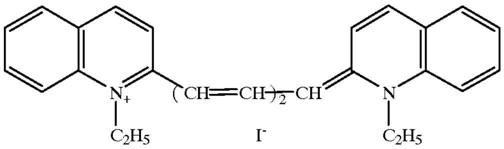
S-6
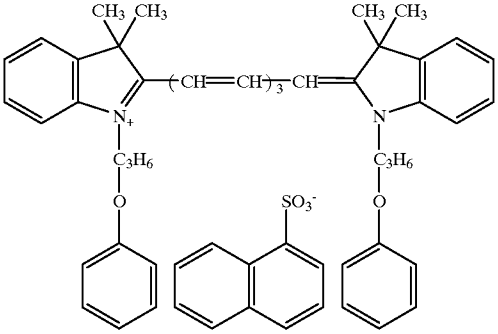
S-7
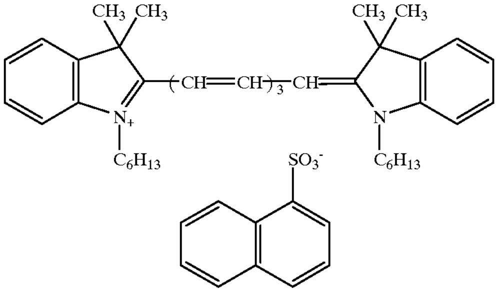
S-8
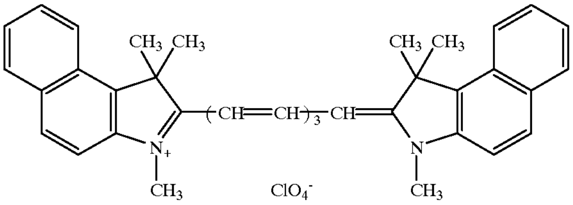

-continued
S-9
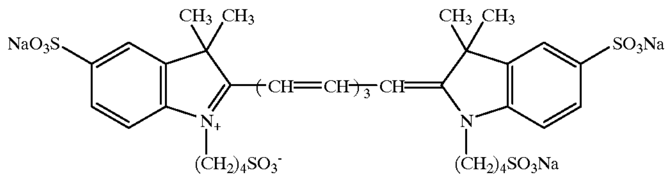
S-10
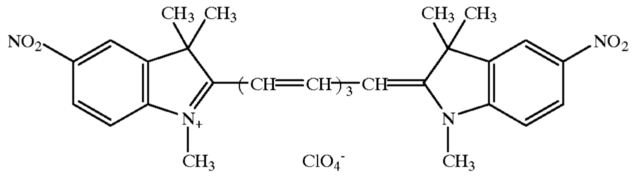
S-11
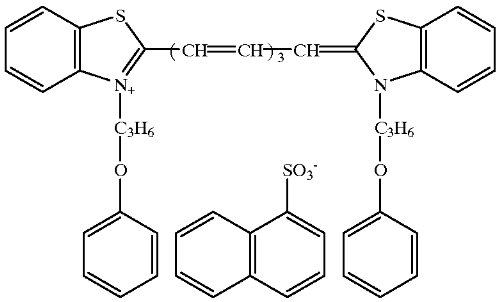
S-12
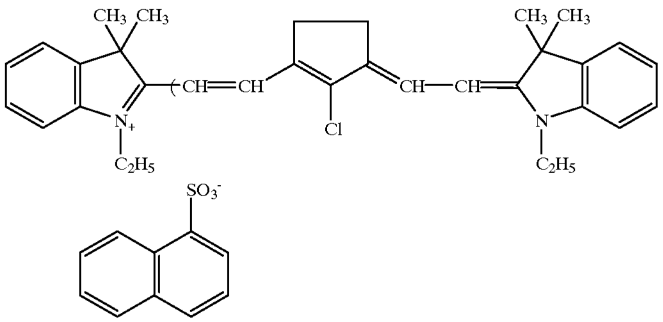
S-13
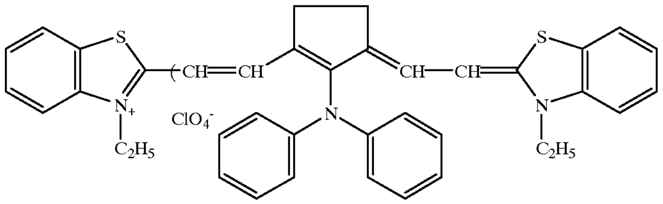
S-14
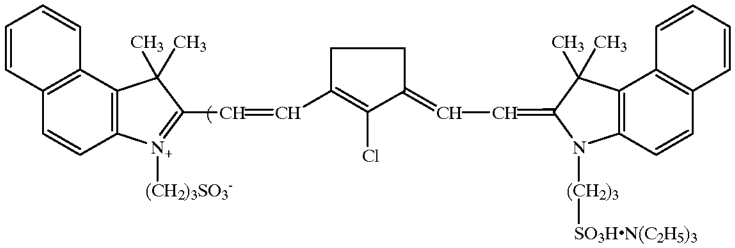

-continued
S-15
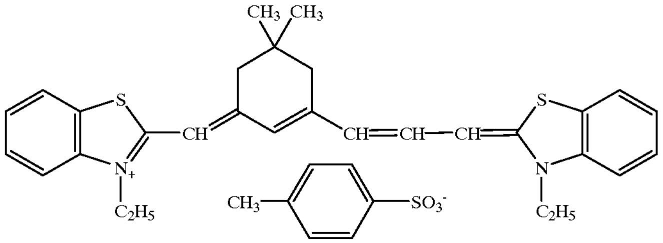
S-16
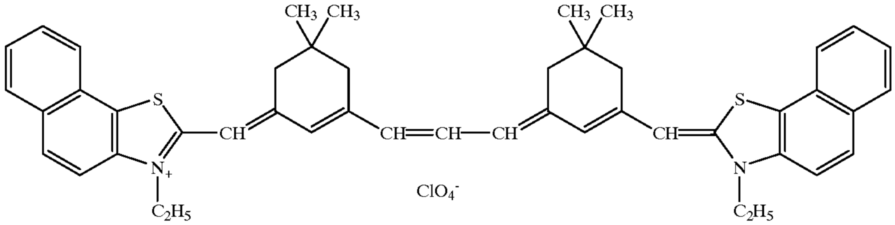
S-17
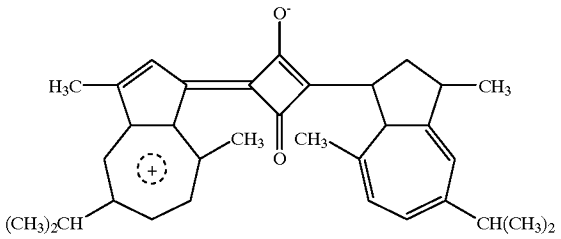
S-18
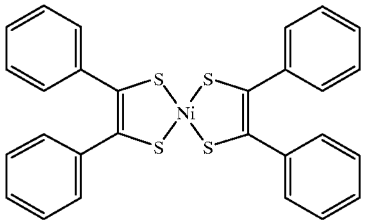
S-19
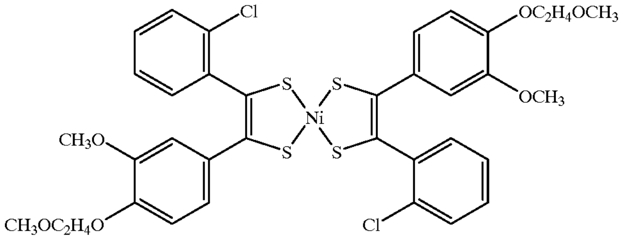
S-20
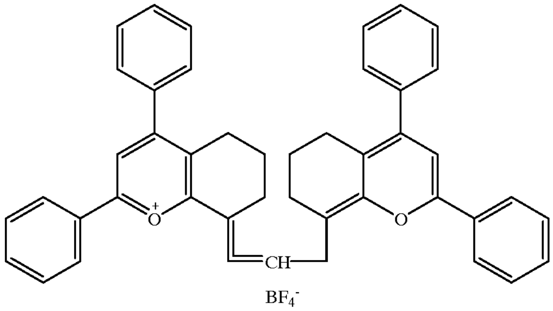
S-21
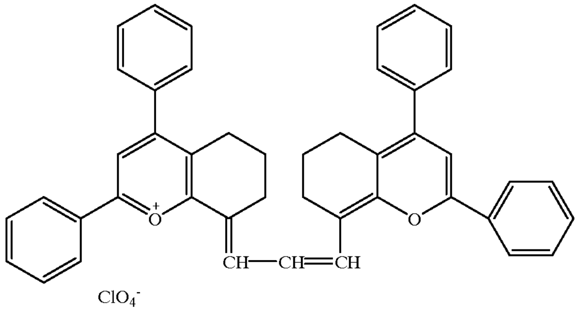

-continued
S-22
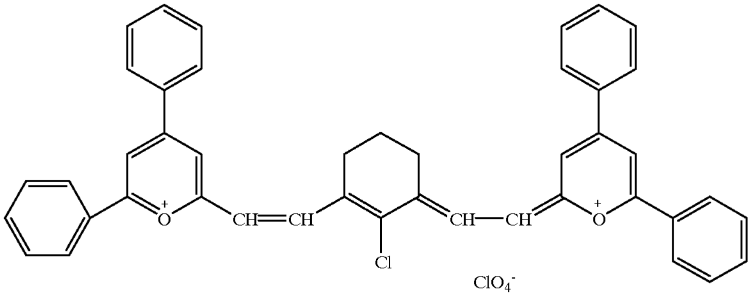
S-23
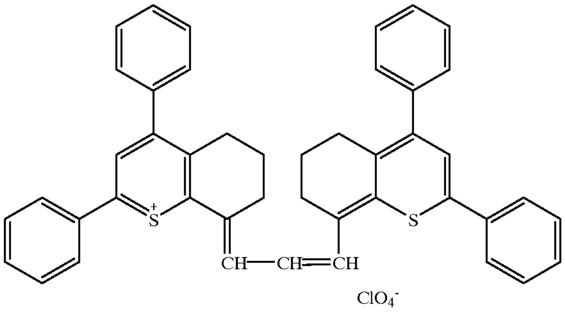
S-24
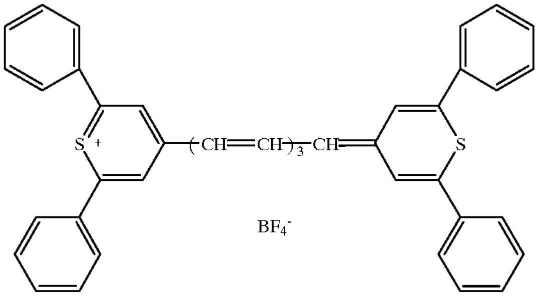
S-25
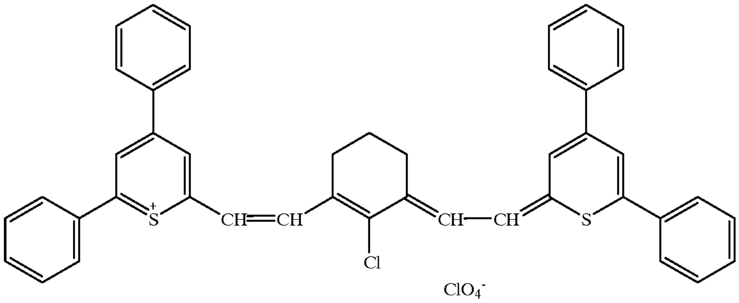
S-26
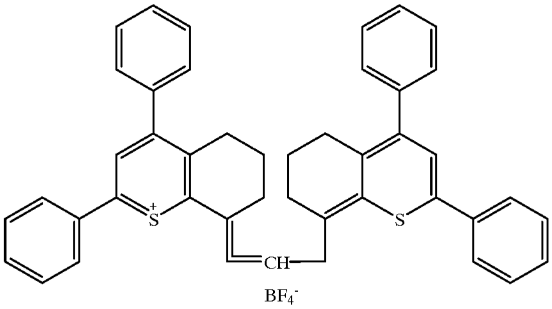

-continued
S-27
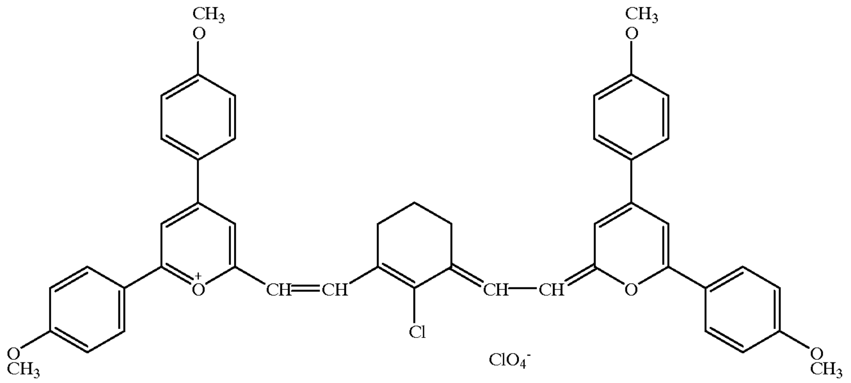
S-28
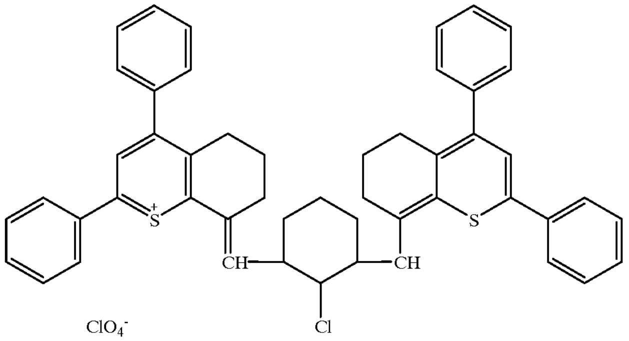
S-29
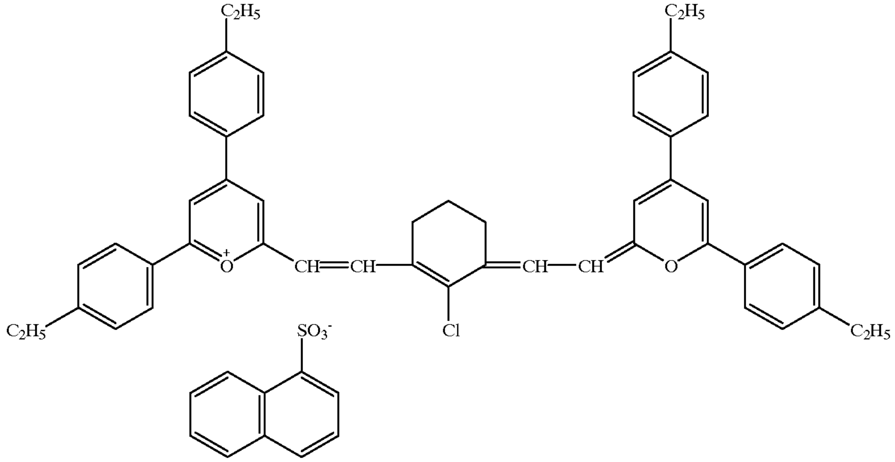

-continued
S-30
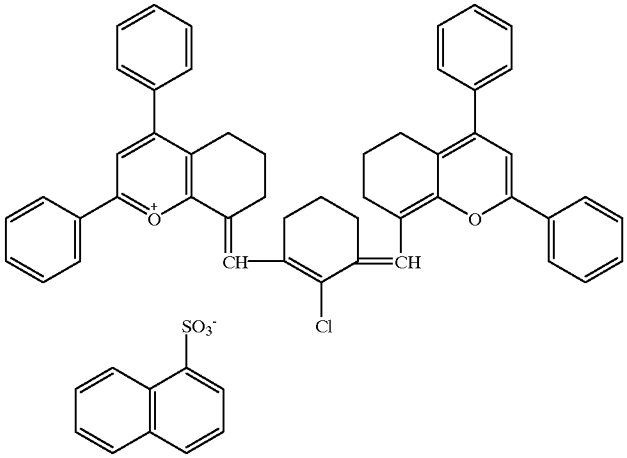
S-31
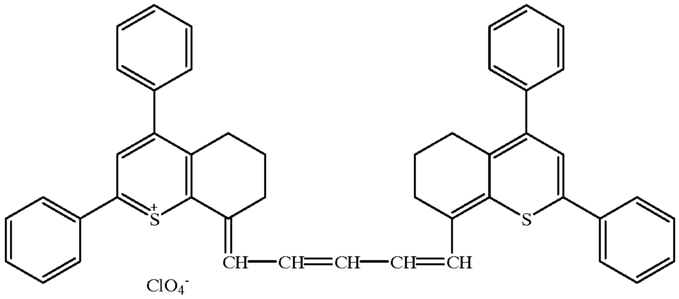
S-32
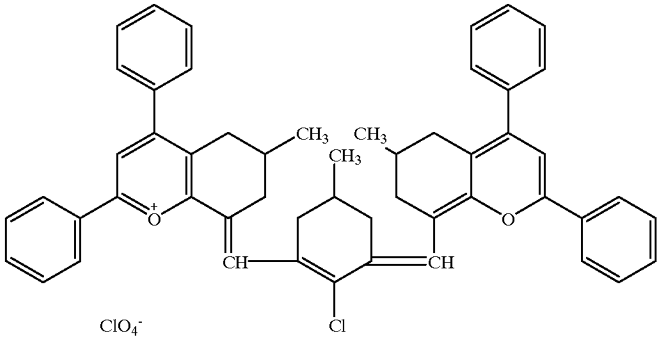
S-33
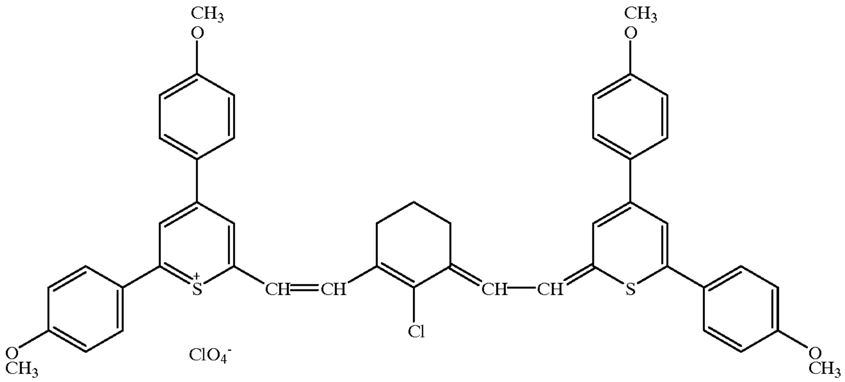

-continued
S-34
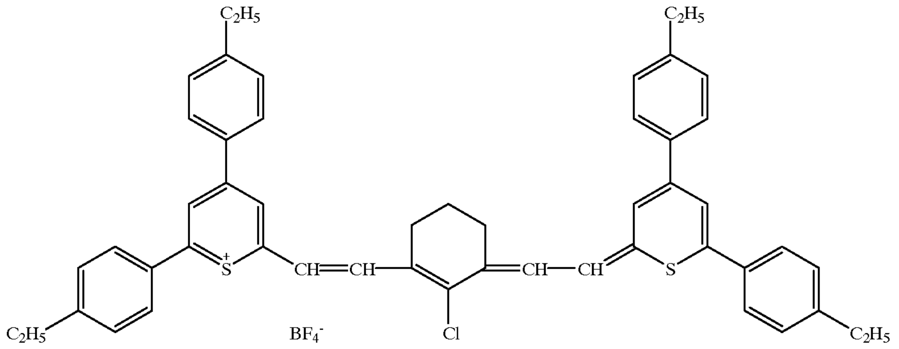
S-35
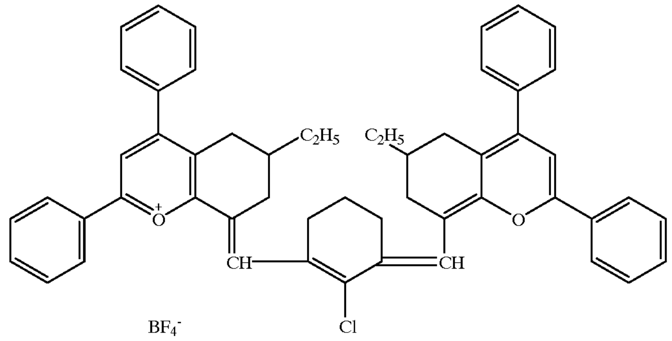
S-36
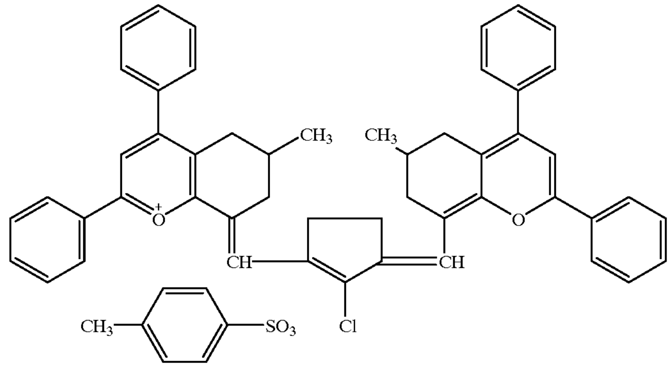
S-37
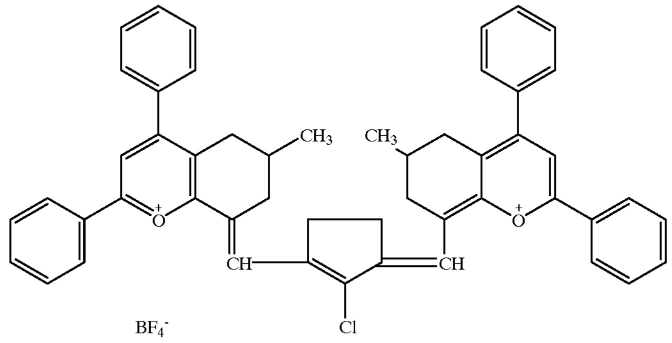

-continued
S-38
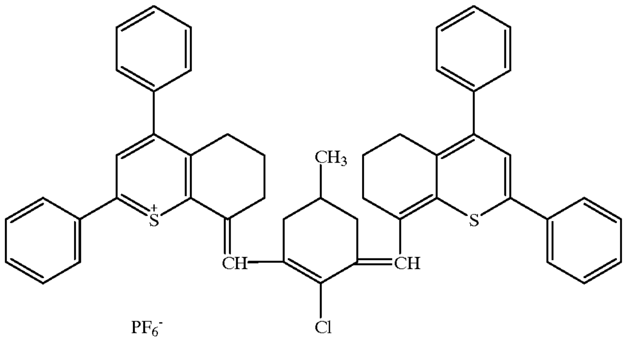
S-39
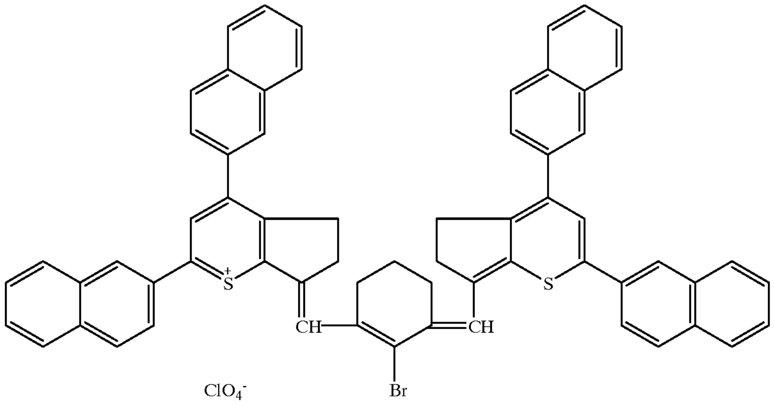
S-40
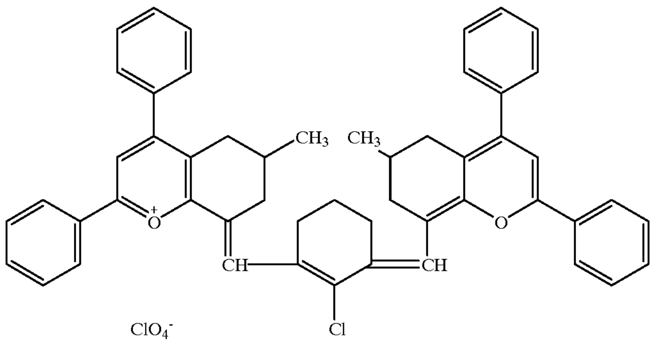
S-41
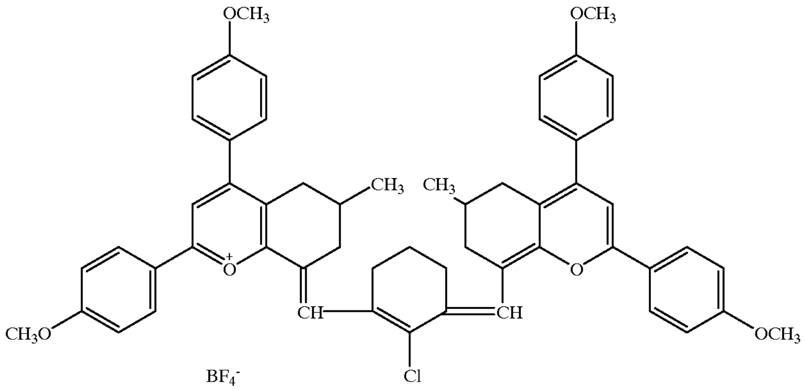

-continued
S-42
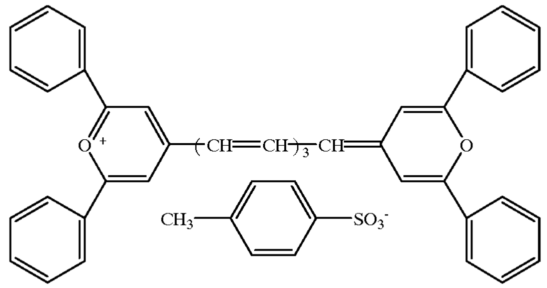
S-43
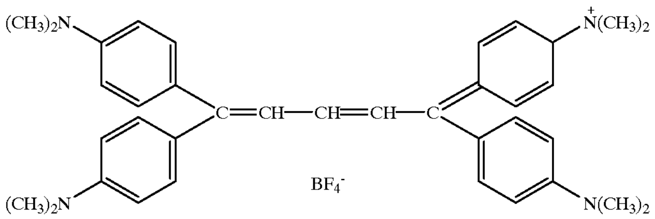
S-44
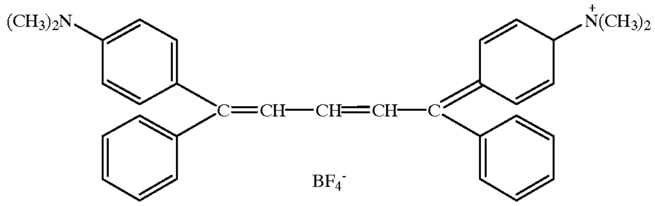
S-45
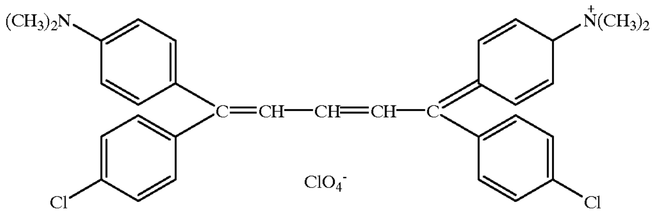
S-46
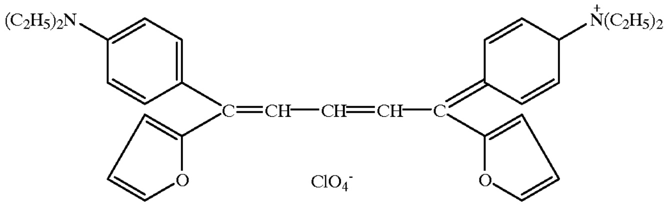
S-47
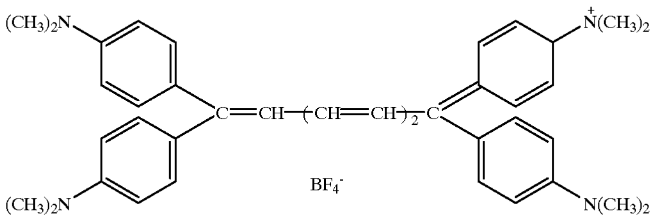

-continued
S-48
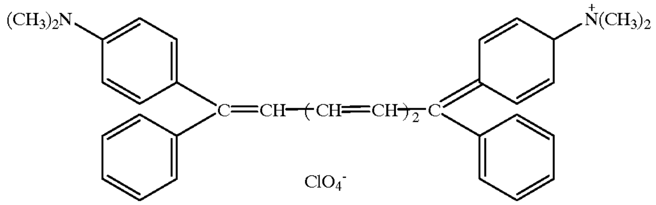
S-49
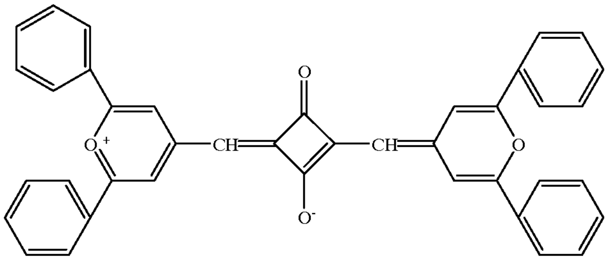
S-50
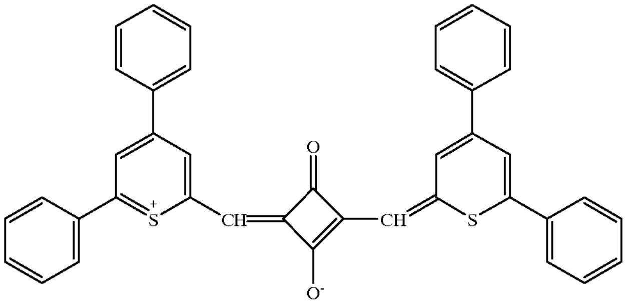
S-51
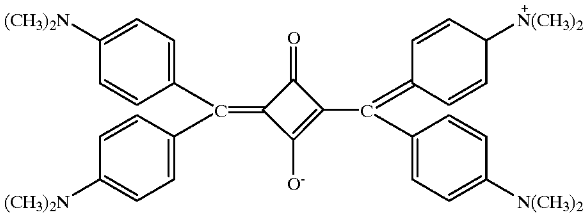
S-52
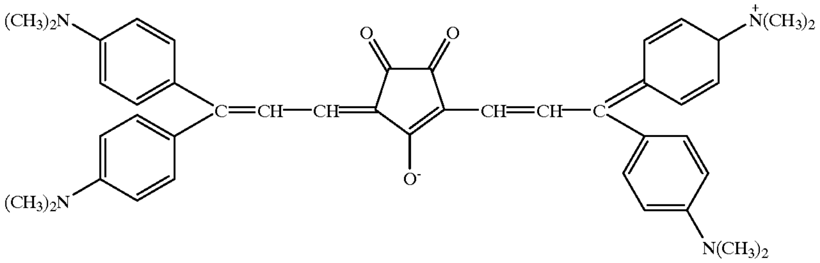
S-53
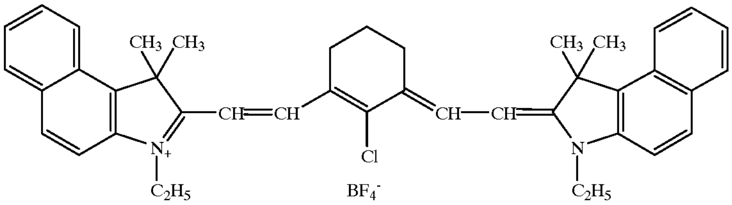

-continued
S-54
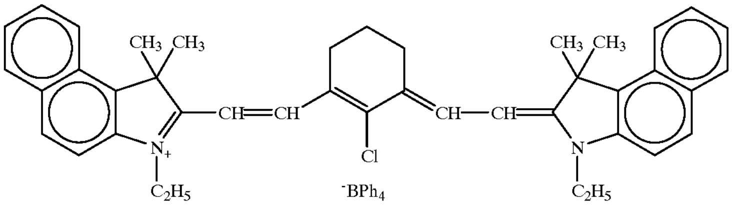
S-55
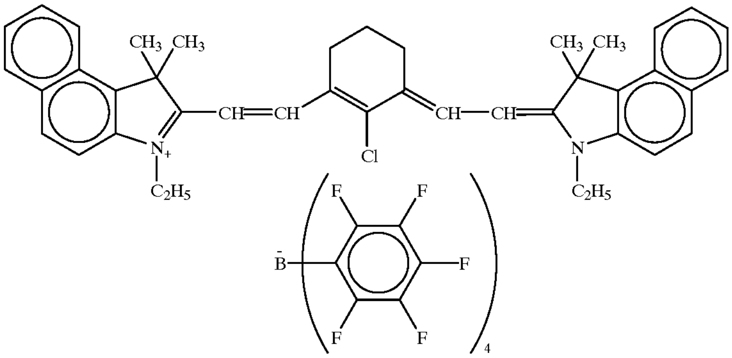
S-56
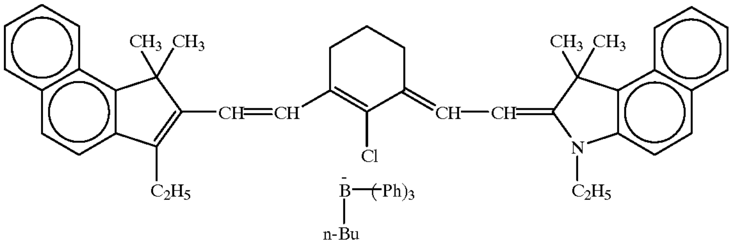
S-57
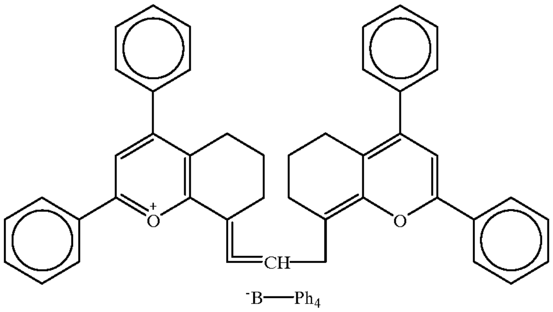
S-58
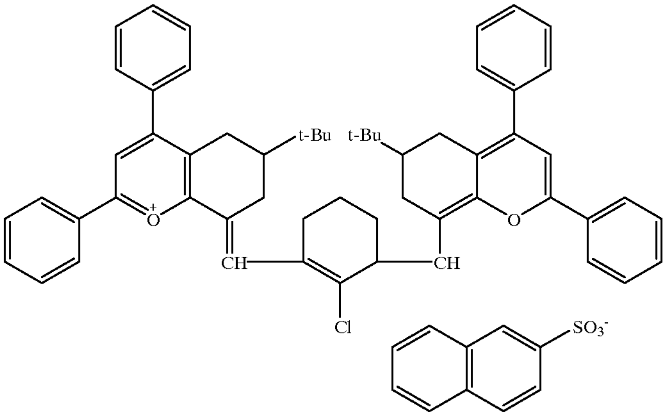

These dyes can be synthesized in accordance with conventional methods. The following dyes may be commercially available.

S-59 polymethine dye: IR-820B (manufactured by Nippon Kayaku K.K.)

S-60 nigrosine dye: Colour Index Solvent Black 5

S-61 nigrosine dye: Colour Index Solvent Black 7

S-62 nigrosine dye: Colour Index Acid Black 2

S-63 carbon black: MA-100 (manufactured by Mitsubishi Chemical Corporation)

S-64 titanium monoxide: Titanium Black 13M (manufactured by Mitsubishi Material K.K.)

S-65 titanium monoxide: Titanium Black 12S (manufactured by Mitsubishi Material K.K.)

Among these, a cyanine dye, a polymethine dye, a squarilium dye, a croconium dye, a pyrylium dye and a thiopyrylium dye are preferred. Further, a cyanine dye, a polymethine dye, a pyrylium dye and a thiopyrylium dye are more preferred.

Among these, particularly preferred is a cyanine dye of the following formula (I) or a polymethine dye of the formula (II), or a pyrylium dye or a thiopyrylium dye of the following formula:

(I)

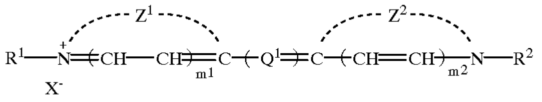

wherein each of $R^1$ and $R^2$ is a $C_{1-8}$ alkyl group which may have a substituent, wherein the substituent is a phenyl group, a phenoxy group, an alkoxy group, a sulfonic acid group, or a carboxyl group; $Q^1$ is a heptamethine group which may have a substituent, wherein the substituent is a $C_{1-6}$ alkyl group, a halogen atom or an amino group, or the heptamethine group may contain a cyclohexene ring or a cyclopentene ring having a substituent, formed by mutual bonding of substituents on two methine carbon atoms of the heptamethine group, wherein the substituent is a $C_{1-6}$ alkyl group or a halogen atom; each of m and m is 0 or 1; each of $Z^1$ and $Z^2$ is a group of atoms required for forming a nitrogen-containing heterocyclic ring; and $X^-$, is a counter anion.

(II)

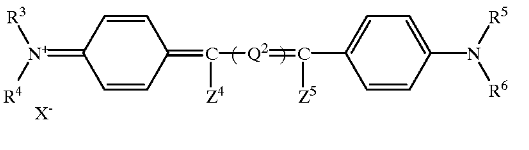

wherein each of $R^3$ to $R^6$ is a $C_{1-8}$ alkyl group; each of $Z^4$ and $Z^5$ is an aryl group which may have a substituent, wherein the aryl group is a phenyl group, a naphthyl group, a furyl group or a thienyl group, and the substituent is a $C_{1-4}$ alkyl group, a $C_{1-8}$ dialkylamino group, a $C_{1-8}$ alkoxy group and a halogen atom; $Q^2$ is a trimethine group or a pentamethine group; and $X^-$ is a counter anion.

(III)

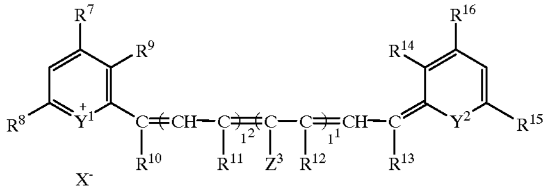

wherein each of $Y^1$ and $Y^2$ is an oxygen atom or a sulfur atom; each of $R^7$ $R^8$, $R^{15}$ and $R^{16}$ is a phenyl group or a naphthyl group which may have a substituent, wherein the substituent is a $C_{1-8}$ alkyl group or a $C_{1-8}$ alkoxy group; each of $1^1$ and $1^2$ which are independent of each other, is 0 or 1; each of $R^9$ to $R^{14}$ is a hydrogen atom or a $C_{1-8}$ alkyl group, or $R^9$ and $R^{10}$, $R^{11}$ and $R^{12}$, or $R^{13}$ and $R^{14}$, are bonded to each other to form a linking group of the formula:

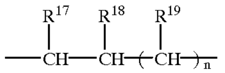

wherein each of $R^{17}$ to $R^{19}$ is a hydrogen atom or a $C_{1-6}$ alkyl group, and n is 0 or 1; $Z^3$ is a halogen atom or a hydrogen atom; and $X^-$ is a counter anion.

The counter anion $X^-$ in each of the above formulas (I), (II) and (III) may, for example, be an inorganic acid anion such as $Cl^-$, $Br^-$, $I^-$, $ClO_4^-$, $BF_4^-$ or $PF_6^-$, or an organic acid anion such as a benzenesulfonic acid, p-toluenesulfonic acid, naphthalenesulfonic acid, acetic acid or organic boric acid.

Now, the compound capable of crosslinking the alkali-soluble resin (a) by a thermal action (hereinafter sometimes referred to as the thermal crosslinking compound for short) to be used in the present invention, will be described in detail. The thermal crosslinking compound is not particularly limited as long as it has a characteristic capable of crosslinking an alkali-soluble resin by a thermal action. However, in the case of a photosensitive lithographic printing plate which is a preferred embodiment of the present invention, the thermal crosslinking compound is preferably a compound which does not cause any inconvenience in alkali solubility after image exposure, since the exposed portion is dissolved by the exposure and the development of the printing plate to form a positive image, and then the compound (a) is crosslinked by heating.

The ratio of the photo-thermal conversion material to be used is usually from 0.1 to 30 wt %, preferably from 1 to 20 wt % and particularly preferably from 1 to 10 wt %, based on the total solid content in the photosensitive composition of the present invention.

Further, as described hereinafter, when the photosensitive lithographic printing plate having a support and a layer made of the photosensitive composition thereon, is exposed and developed, and then subjected to heat treatment, the photosensitive composition of the present invention serves to increase the strength of the image portion and thus improve so-called printing resistance. Accordingly, more specifically, the thermal crosslinking compound may, for example, be a compound capable of crosslinking the alkali-soluble resin by heating at the heat treatment temperature, i.e. usually at a temperature of from 150° C. to 300° C.

The thermal crosslinking compound may, for example, be a nitrogen-containing compound having a thermal crosslinking property, preferably a compound having an amino group, more specifically, an amino compound having at least two functional groups such as methylol groups or alkoxymethyl groups as their alcohol condensation modification products, or acetoxymethyl groups.

More specifically, the compound having an amino group is a compound having at least two groups represented by the following formula (T) in its structure:

(T)

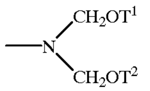

wherein each of $T^1$ and $T^2$ which are independent of each other, represents a hydrogen atom, an alkyl group, an alkenyl group or an acyl group. The number of carbon atoms in the alkyl group represented by $T^1$ or $T^2$ in the formula (T), is usually from 1 to 8, preferably from 1 to 4, the number of carbon atoms in the alkenyl is usually from 2 to 18, preferably from 2 to 4, the number of carbon atoms in the acyl group is usually from 2 to 18, preferably from 2 to 4. The group represented by the formula (T) may, for example, be a methoxymethylolamino group, a dimethoxymethylamino group, a dimethylolamino group (i.e. a dihydroxymethylamino group) or a diethoxymethylamino group.

The compound having at least two groups of the above formula (T) in its structure may, for example, be a compound having a melamine skeleton, a compound having a benzoguanamine skeleton, a compound having a glycoluryl skeleton, a compound having an urea skeleton, a compound represented by (T-2), (T-3) or (T-4), or a compound made by condensation of compounds represented by the formulae (T-1) to (T-4) by means of a bivalent connecting group (hereinafter referred to simply as a condensate).

(T-1)

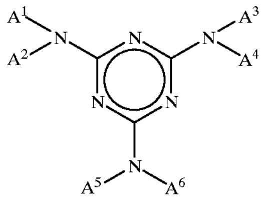

wherein each of $A^1$–$A^6$ which are independent of one another, represents —$CH_2OU$, wherein U is a hydrogen atom, an alkyl group, an alkenyl group or an acyl group.

(T-2)

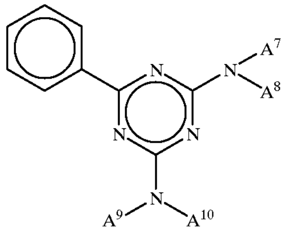

wherein each of $A^7$–$A^{10}$ which are independent of one another, represents —$CH_2OU$, wherein U represents same as U in the formula (T-2).

(T-3)

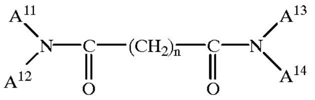

wherein each of $A^{11}$–$A^{14}$ which are independent of one another, represents —$CH_2OU$, wherein U represents same as U in the formula (T-2).

(T-4)

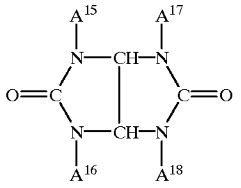

wherein each of $A^{15}$–$A^{18}$ which are independent of one another, represents —$CH_2OU$, wherein U is a hydrogen atom, an alkyl group, an alkenyl group or an acyl group.

The number of carbon atoms in the group represented by U in the above formulae (T-1) to (T-4) is preferably the same as in $T^1$ and $T^2$ in the formula (T)

Examples of the compound represented by the formula (T-1) and its condensate will be presented as follows.

(T-1-1)

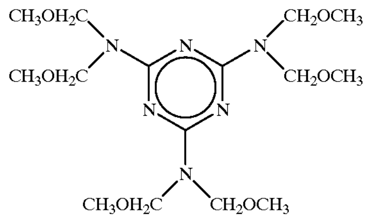

(T-1-2)

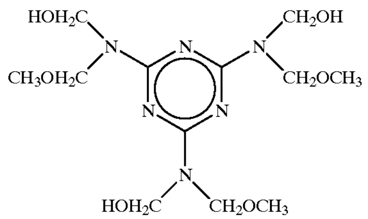

(T-1-3)

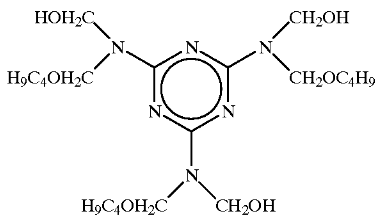

-continued
(T-1-4)
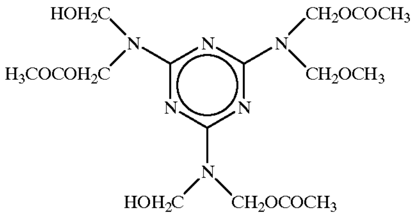
(T-1-5)
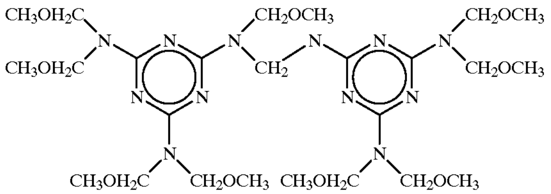
Examples of the compound represented by the formula (T-2) and its condensate will be presented as follows.
(T-2-1)
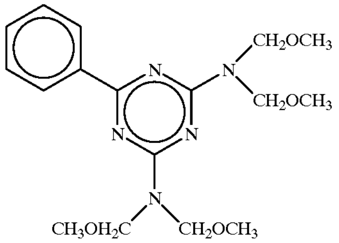
(T-2-2)
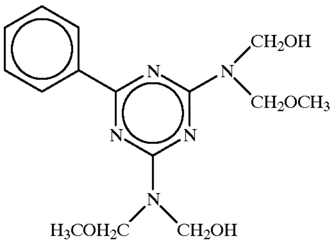
-continued
(T-2-3)
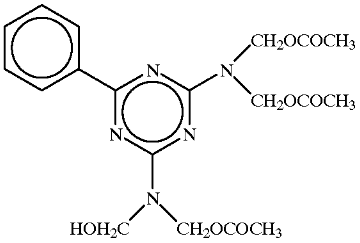
(T-2-4)
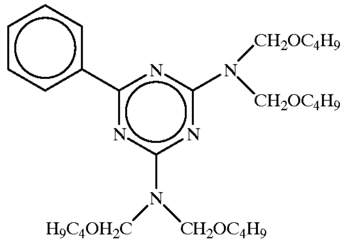
(T-2-5)
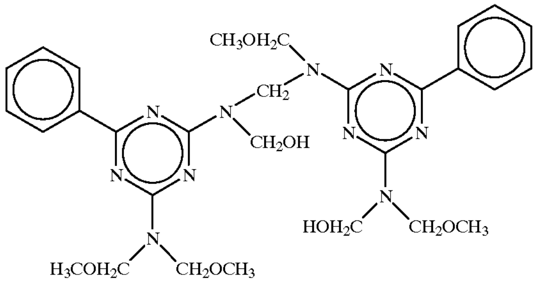
Examples of the compound represented by the formula (T-3) and its condensate will be presented as follows.
(T-3-1)
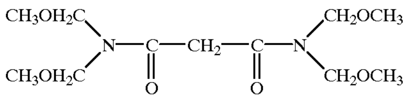
(T-3-2)
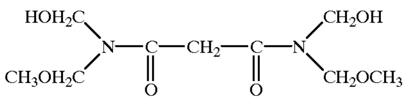
(T-3-3)
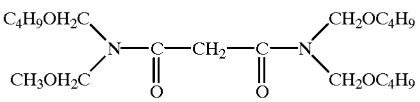

-continued (T-3-4)

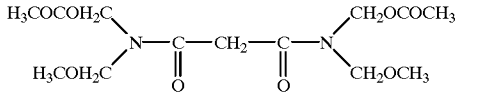

(T-3-5)

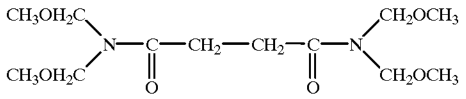

(T-3-6)

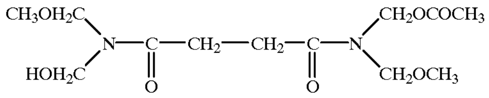

(T-3-7)

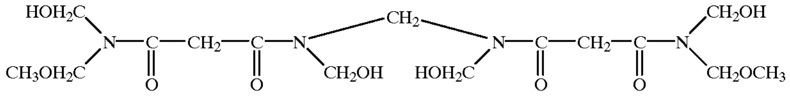

Examples of the compound represented by the formula (T-4) and its condensate will be presented as follows.

(T-4-1)

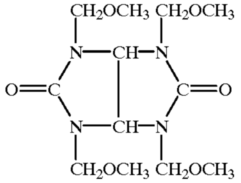

(T-4-2)

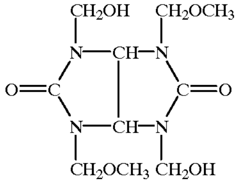

(T-4-3)

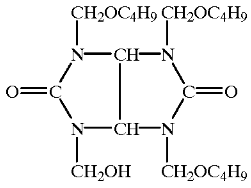

(T-4-4)

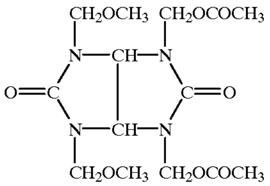

-continued (T-4-5)

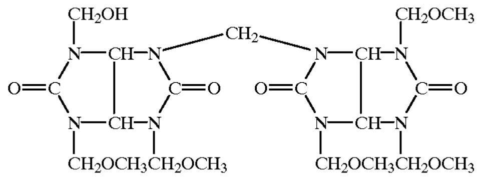

If the photosensitive lithographic printing plate of the present invention as described hereinafter is treated at a too high temperature, aluminum of the support may undergo deformation, and reproducibility of the image is likely to deteriorate. Whereas, in a case where the thermal crosslinking compound is a compound having an amino group, a sufficient crosslinking effect appears at a relatively low temperature of about 200° C., in a short period of time, and a sufficient chemical resistance and printing resistance can be obtained, such being more favorable.

The compound having an amino group is preferably one having a heterocyclic structure, particularly a nitrogen-containing heterocyclic structure, more preferably a melamine compound represented by the above formula (T-1) or its condensate, particularly preferably a compound represented by the above formula (T-1). Among compounds of the formula (T-1), preferred is one wherein each of $A^1$ to $A^6$ which are independent of one another, is —$CH_2OU$, wherein U is a hydrogen atom or a $C_{1-4}$ alkyl group. Further, one having an alkoxylation ratio (the ratio (molar ratio) of U of —$CH_2OU$ being a $C_{1-4}$ alkyl group, in the total —$CH_2OU$ represented by $A^1$ to $A^6$) of at least 70%, preferably from 80% to 100%, is advantageous. Still further, particularly advantageous is a case where U is a hydrogen atom or a methyl groups, and methoxylation ratio (the ratio (molar ratio) of U of —$CH_2OU$ being a methyl group in the total —$CH_2OU$) is from 80 to 100%.

Specifically, the amino compound may, for example, be a melamine derivative such as methoxy methylated melamine (e.g. Cymel 300 series (1) by Mitsui Cytec Company (former Mitsui Cyanamid Company)), a benzoguanamine derivative such as a methyl/ethyl mixed alkoxylated benzoguanamine resin (e.g. Cymel 1100 series (2) by Mitsui Cytec Company), a glycoluryl derivative such as a tetramethylol glycoluryl resin (e.g. Cymel 1100 series (3) by Mitsui Cytec Company), or other urea resin derivatives.

Among these, a melamine derivative is particularly preferred.

The amount of such a thermal crosslinking compound (c) is preferably from 0.1 to 50 wt %, particularly preferably from 0.5 to 30 wt %, based on the total solid content of the photosensitive composition of the present invention.

If the content of the above thermal crosslinking compound is too small, in a case where the photosensitive composition of the present invention is used for the photosensitive lithographic printing plate as described hereinafter, the fastness of the coating film, such as chemical resistance or strength, deteriorates, and accordingly printing resistance deteriorates. If it is too large, it is feared that the alkali solubility of the exposed portion tends to be low and the solubility contrast between an image portion and a non-image portion deteriorates.

The photosensitive composition of the present invention has (a) an alkali-soluble resin, (b) a photo-thermal conversion material and (c) a compound capable of crosslinking the alkali-soluble resin by a thermal action, as essential components. The positive image formation by means of the composition, utilizes, as described above, the alkali-easy-solubilizing phenomenon at the exposed portion which is considered to be due to the conformation change in the portion irradiated with near infrared light rays. Accordingly, it is clearly distinguished from the image formation system by means of the known negative photosensitive composition of a chemical amplification type. Therefore, with the photosensitive composition of the present invention, it is not required to contain a compound which has a function to generate an acid when exposed in the coexistence of the photo-thermal conversion material (hereinafter referred to as a photo-acid-generator), which is required as an essential component by the negative photosensitive composition of a chemical amplification type. Accordingly, the photosensitive composition of the present invention contains substantially no photo-acid-generator.

The above "when exposed" means, more specifically, "when exposed by a light rays with a wavelength of from 650 to 1,300 nm".

The above photo-acid-generator is not particularly limited as long as it is a compound having the above function. It may, for example, be a latent Brønsted acid (a precursor which decomposes to form a Brønsted acid) as described in JP-A-7-20629 and a haloalkyl-substituted S-triazine as described in JP-A-7-271029 or a photosensitive acid-forming agent as described in EP784233.

In other words, the composition of the present invention does not substantially contain a compound which generates an acid under exposure condition of the photosensitive composition, such as the latent Brønsted acid as described in JP-A-7-20629 and/or a compound which can generates an acid by the amplification action between the photo-thermal conversion material. This difference may be explained in such a way that the composition of the present invention is for positive, while the composition described in JP-A-7-20629 is for both positive and negative, and the image forming mechanism is different.

The composition of the present invention does not contain a latent Brønsted acid or a haloaklkyl-substituted S-triazine compound, as mentioned above. Therefore, it has an advantage that it can be operated under white light.

Namely, the positive photosensitive composition (the photosensitive layer of the photosensitive lithographic printing plate as described hereinafter) of the present invention presents substantially no significant change in the solubility in an alkali developer, even when it is left to stand for 10 hours under irradiation with a light intensity of 400 lux under a white fluorescent lamp (36 W white fluorescent lamp Neolumisuper FLR 40 S-W/M/36, by Mitsubishi Electric Company, Ltd.). Here, "presents substantially no significant change in the solubility" means that the change in the film thickness of an image obtained by exposure and development under a condition to form 3% halftone dots, is within 10% as between before and after the printing plate having a layer made of the positive photosensitive composition of the present invention, formed on a support, is left to stand for 10 hours.

The photosensitive composition of the present invention may contain an additive, for example, a compound (d) which can suppress the alkali solubility of a mixture having at least (a) an alkali-soluble resin and (b) a photo-thermal conversion material, in order to improve the solubility contrast as between an image portion and a non-image portion. The compound (d) is not particularly limited as long as it often acts advantageously for the image contrast obtained, and it is a compound having an alkali-solublility suppressing effect. It may, for example, be a carboxylic acid ester, a phosphoric ester, or a sulfonic acid ester. The more preferable examples are lactone ring-containing dyes, as illustrated hereinafter. Such a lactone ring-containing dye is a compound having a function also as an excellent development visible image agent. Namely, the dye having such a lactone ring is an almost colorless or light colored substance itself, but in the alkali-soluble resin such as a novolak resin, it strongly develops a color. The mechanism of how such a lactone ring-containing dye suppresses the alkali solution is not clearly understood. However, formation of a proton transfer complex with an alkali-soluble resin, may, for example, be conceivable.

L-1
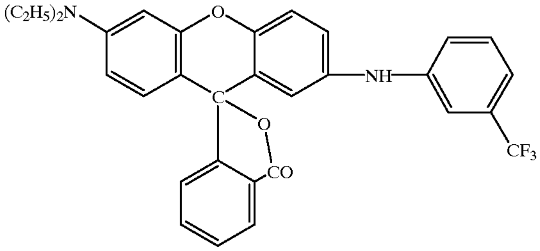
L-2
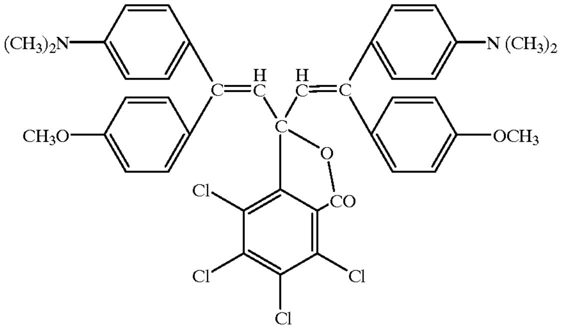
L-3
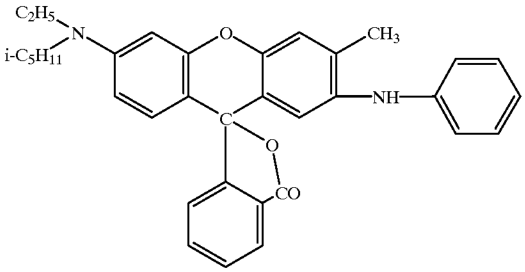
L-4
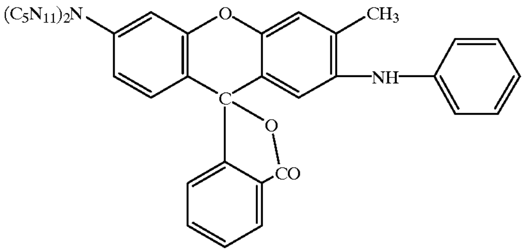
L-5
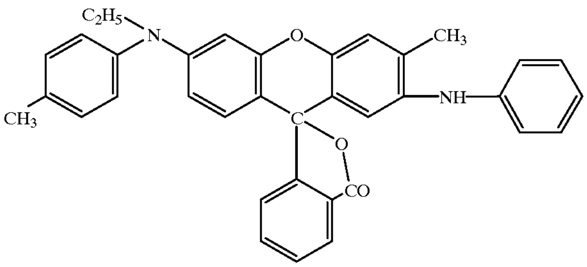
L-6
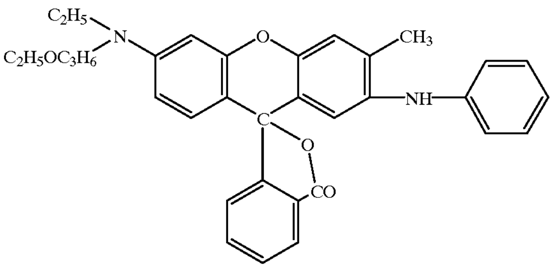
L-7
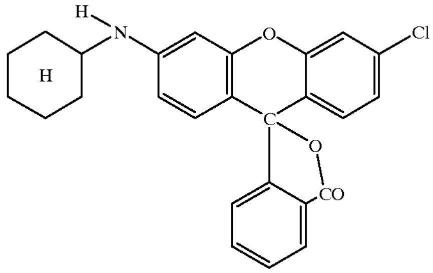
L-8
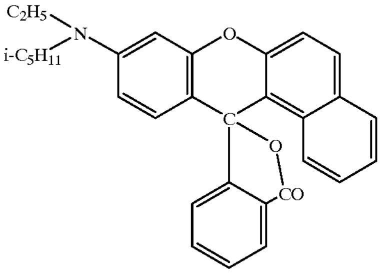
L-9
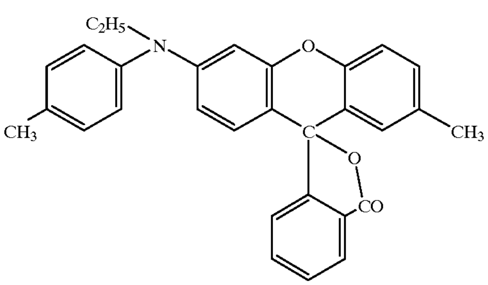
L-10
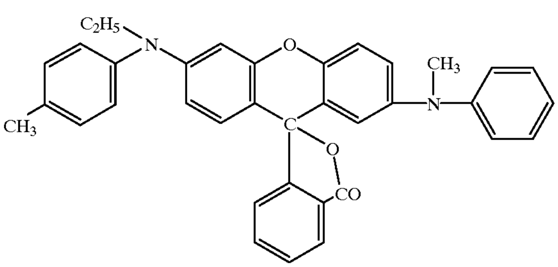

-continued
L-11
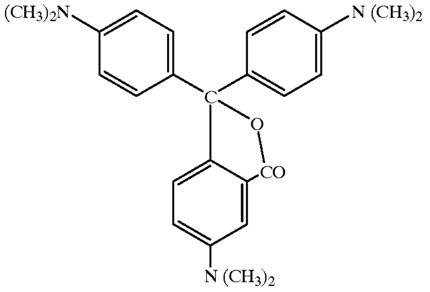
L-12
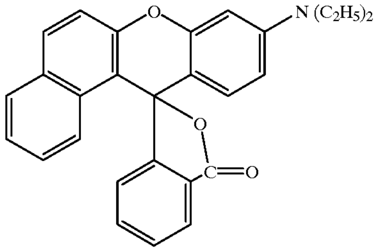
L-13
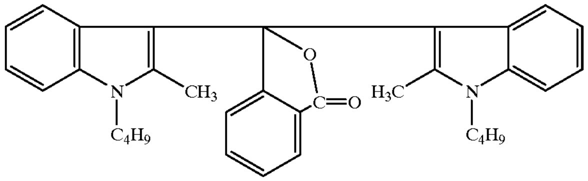
L-14
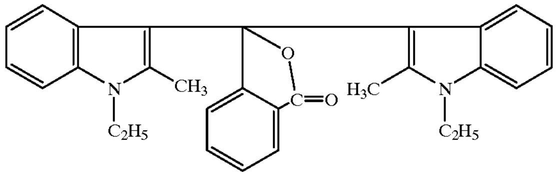
L-15
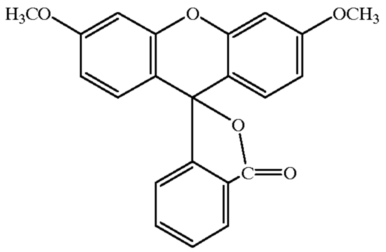
L-16
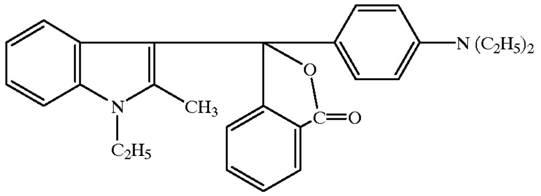
L-17
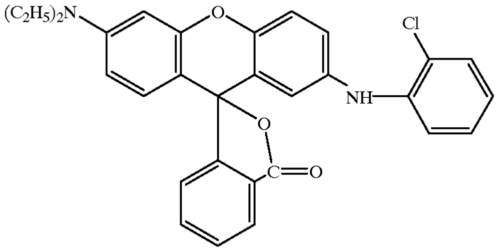
L-18
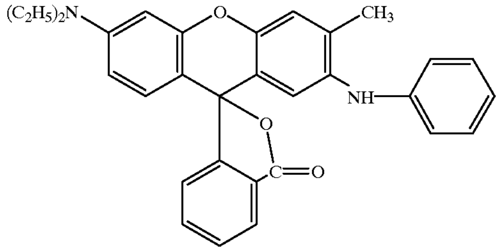
L-19
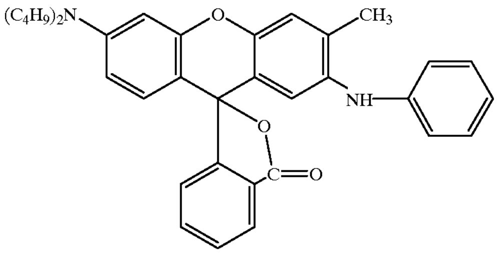
L-20
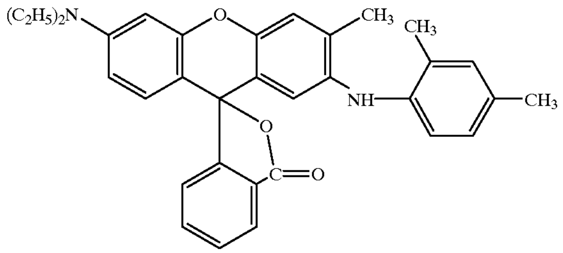

-continued
L-21
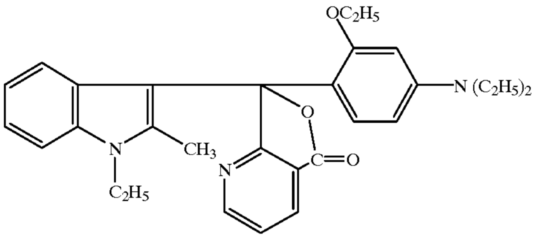
L-22
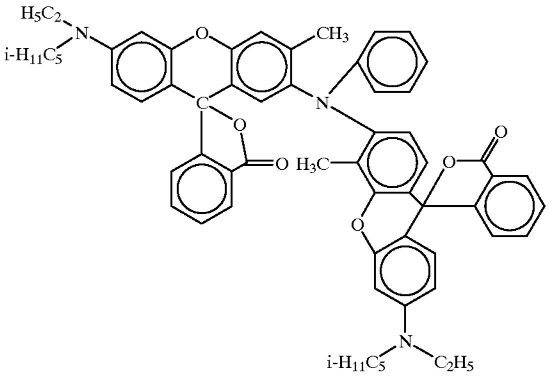
L-23
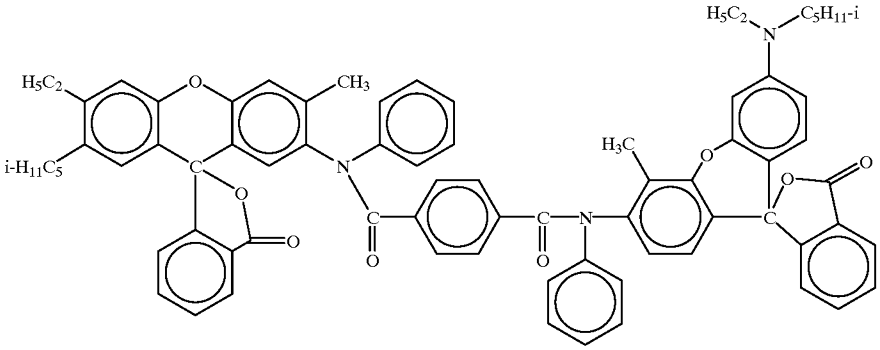
L-24
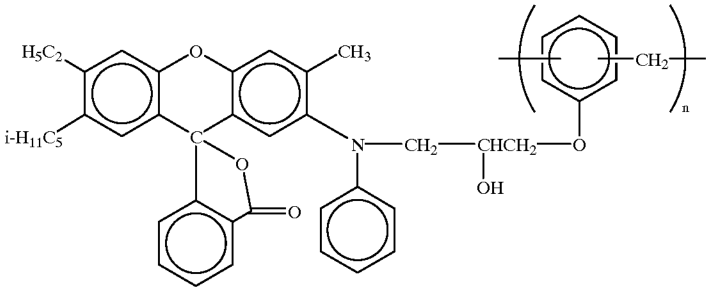
L-25
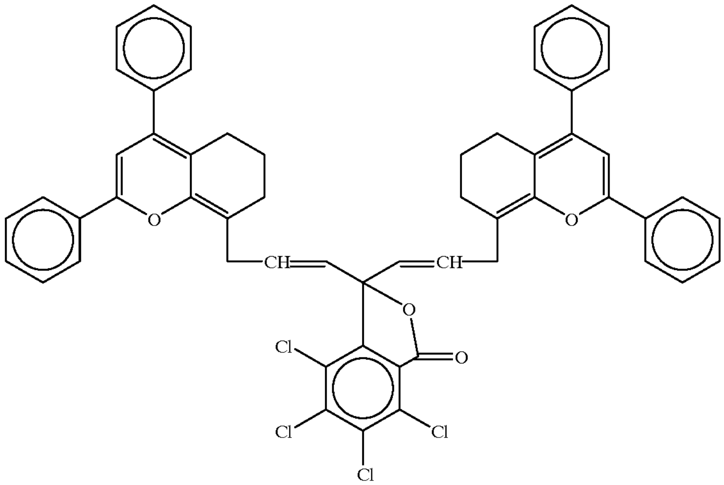

-continued

L-26

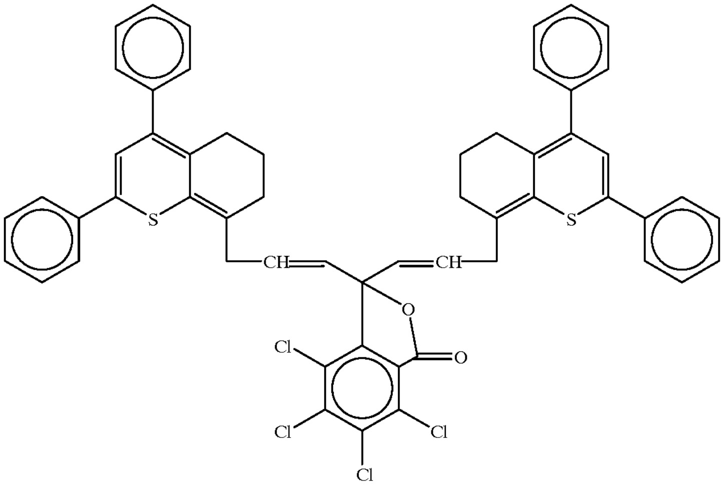

L-27

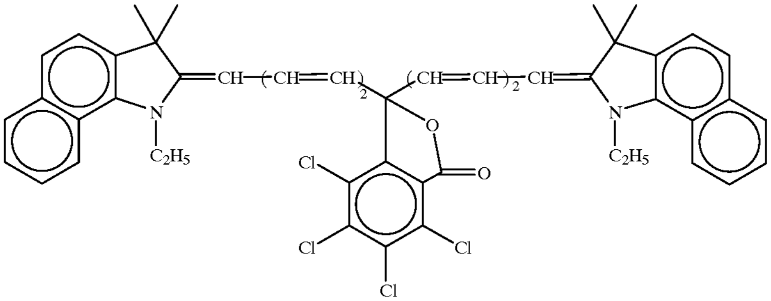

L-28

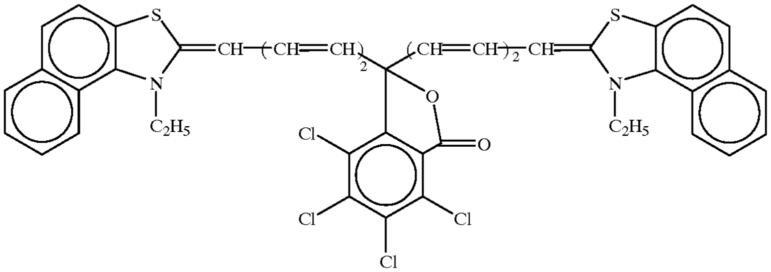

L-29

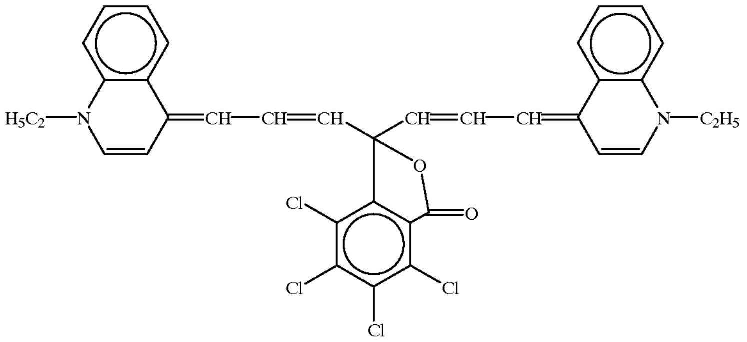

Among these, a lactone ring-containing dye compound is particularly preferred as the compound (d)).

Such a solubility-suppressing agent component (d) of the present invention is used as the case requires, and the blend ratio is from 0 to 50 wt %, preferably from 1 to 40 wt %, more preferably from 2 to 30 wt %, based on the total solid content of the photosensitive composition.

Further, in the photosensitive composition, a coloring material other than one described above may be incorporated as the case requires. As the coloring material, a pigment or a dye may be used. For example, Victoria Pure Blue (42595), Auramine 0 (41000), Catilon Briliant Flavin (basic 13), Rhodamine 6GCP (45160), Rhodamine B (45170), Safranine OK70: 100(50240), Eric Grawsin GX (42080), Fast Black HB (26150), No. 120/Lionol Yellow (21090), Lionol Yellow GRO (21090), Similor First Yellow 8GF (21105), Benzidine Yellow 4T-564D (21095), Shimilor First Red 4015 (12355), Lionol Red B4401 (15850), Fast Gen Blue TGR-L (74160), or Lionol Blue SM (26150), may be mentioned. The numerals in the above brackets ( ) indicate the color index (C.I.).

The blend ratio of the coloring material is usually from 0 to 50 wt %, preferably from 2 to 30 wt %, based on the solid content of the entire photosensitive layer composition.

The photosensitive composition of the present invention is prepared usually by dissolving the above described various components in a suitable solvent. The solvent is not particularly limited as long as it is a solvent which presents an excellent coating film property and provides sufficient solubility for the components used. It may, for example, be a cellosolve solvent such as methylcellosolve, ethylcellosolve, methylcellosolve acetate or ethylcellosolve acetate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, an ester solvent such as butyl acetate, amyl acetate, ethyl butyrate, butyl butyrate, diethyl oxalate, ethyl pyruvate, ethyl-1-hydroxy butyrate, ethyl acetoacetate, methyl lactate, ethyl lactate or methyl 2-methoxypropionate, an alcohol solvent such as heptanol, hexanol, diacetone alcohol or furfuryl alcohol, a ketone solvent such as cyclohexanone or methyl amyl ketone, a highly polar solvent such as dimethyl formamide, dimethyl acetamide or N-methyl pyrrolidone, or a solvent mixture thereof, or the one having an aromatic hydrocarbon added thereto. The proportion of the solvent is usually within a range of from 1 to 20 times in a weight ratio to the total amount of the photosensitive material.

The photosensitive composition of the present invention may contain various additives, such as a coating property-improving agent, a development-improving agent, an adhesion-improving agent, a sensitivity-improving agent, an oleophilic agent, within a range not to impair the performance of the composition.

The second aspect of the present invention relates to the photosensitive lithographic printing plate, which is advantageously useful as a photosensitive lithographic printing plate having a photosensitive layer made of the above positive photosensitive composition on a support, prepared by coating the photosensitive composition of the present invention on the support.

As a method for coating the photosensitive layer on the surface of a support, a conventional method such as rotational coating, wire bar coating, dip coating, air knife coating, roll coating, blade coating or curtain coating may, for example, be employed. The temperature for drying or for heating is, for example, from 20 to 170° C., preferably from 30 to 150° C.

The film thickness of the photosensitive layer is usually from 0.5 to 10 μm, preferably from 1 to 7 μm, more preferably from 1.5 to 5 μm.

The support on which a photosensitive layer made of the photosensitive composition to be used for the present invention will be formed, may, for example, be a metal plate of e.g. aluminum, zinc, steel or copper, a metal plate having chromium, zinc, copper, nickel, aluminum, iron or the like plated or vapor-deposited thereon, a paper sheet, a plastic film, a glass sheet, a resin-coated paper sheet, a paper sheet having a metal foil such as aluminum bonded thereto, or a plastic film having hydrophilic treatment applied thereto. Among them, preferred is an aluminum plate. As the support for a photosensitive lithographic printing plate, it is particularly preferred to employ an aluminum plate having grain treatment applied by brush polishing or electrolytic etching in a hydrochloric acid or nitric acid solution, having anodizing treatment applied in a sulfuric acid solvent and, if necessary, having surface treatment such as pore sealing treatment applied.

The roughness of the surface of the support is usually represented by the surface roughness Ra. This can be measured by using a surface roughness meter. The support to be used in the present invention is preferably an aluminum plate having an average roughness Ra of from 0.3 to 1.0 μm, more preferably from 0.4 to 0.8 μm.

The support may further be subjected to surface treatment with an organic acid compound before use, if necessary.

The third aspect of the present invention relates to a treatment method of the above photosensitive lithographic printing plate.

The light source for image exposure of the photosensitive composition and the photosensitive lithographic printing plate of the present invention is not limited as long as the photo-thermal conversion material can attain the purpose, and particularly a light source for generating a light ray such as a near infrared laser beam of from 650 to 1,300 nm is preferred. For example, a ruby laser, a YAG laser, a semiconductor laser, LED or other solid laser may be mentioned. Particularly preferred is a semiconductor laser or a YAG laser which is small in size and has a long useful life. With such a laser light source, scanning exposure is usually carried out, and then development is carried out with a developer to obtain an image.

The laser light source is used to scan the surface of a photosensitive material in the form of a high intensity light ray (beam) focused by a lens, and the sensitivity characteristic ($mJ/cm^2$) of the positive lithographic printing plate of the present invention responding thereto may sometimes depend on the light intensity ($mJ/s \cdot cm^2$) of the laser beam received at the surface of the photosensitive material. Here, the light intensity ($mJ/s \cdot cm^2$) of the laser beam can be determined by measuring the energy per unit time (mJ/s) of the laser beam on the printing plate by a light power meter, measuring also the beam diameter (the irradiation area: $cm^2$) on the surface of the photosensitive material, and dividing the energy per unit time by the irradiation area. The irradiation area of the laser beam is usually defined by the area of the portion exceeding $1/e^2$ intensity of the laser peak intensity, but it may simply be measured by sensitizing the photosensitive material showing reciprocity law.

The light intensity of the light source to be used in the present invention is preferably at least $2.0 \times 10^6$ $mJ/s \cdot cm^2$, more preferably at least $1.0 > 10^7$ $mJ/s \cdot cm^2$. If the light intensity is within the above range, the sensitivity characteristic of the positive photosensitive composition of the present invention can be improved, and the scanning exposure time can be shortened, such being practically very advantageous.

As the developer to be used for developing the photosensitive composition of the present invention, an alkali developer composed mainly of an aqueous alkali solution is particularly preferred.

As the alkali developer, an aqueous solution of an alkali metal salt such as sodium hydroxide, potassium hydroxide, sodium carbonate, potassium carbonate, sodium metasilicate, potassium metasilicate, sodium secondary phosphate or sodium tertiary phosphate, may, for example, be mentioned. The concentration of the alkali metal salt is preferably from 0.1 to 20 wt %. Further, an anionic surfactant, an amphoteric surfactant or an organic solvent such as an alcohol, may be added to the developer, as the case requires.

In the case of the positive photosensitive lithographic printing plate, it is possible to obtain a positive image by developing treatment without heating after exposure as mentioned above. Further, a firm image can be obtained by heat treatment after development. The heat treatment after development is carried out preferably at a temperature of usually from 150 to 300° C.

However, as mentioned above, if treated at a too high temperature, aluminum of the support may undergo deformation and producibility of the image is likely to deteriorate. Therefore, a temperature within a range of from 180° C. to 230° C. is particularly preferred. The suitable heating time is determined depending upon the heating temperature, but it is usually from 30 seconds to 30 minutes at a temperature of from 150 to 300° C., preferably from 1 minute to 20 minutes at a temperature of from 180° C. to 230° C., for example, from 3 to 10 minutes at a temperature of 200° C.

Now, the present invention will be described in further detail with reference to Examples. However, it should be understood that the present invention is by no means restricted to such specific Examples.

Preparation of an aluminum plate

An aluminum plate (material: 1050, hardness: H16) having a thickness of 0.24 mm was subjected to degreasing treatment at 60° C. for one minute in a 5 wt % sodium hydroxide aqueous solution and then to electrolytic etching treatment in an aqueous hydrochloric acid solution having a concentration of 0.5 mol/l at a temperature of 25° C. at a current density of 2 60 A/$dm^2$ for a treating time of 30 seconds. Then, it was subjected to desmut treatment in a 5 wt % sodium hydroxide aqueous solution at 60° C. for 10 seconds and then to anodizing treatment in a 20 wt % sulfuric acid solution at a temperature of 20° C. at a current density of 3 A/$dm^2$ for a treating time of one minute. Further, it was subjected to a hydrothermal pore sealing treatment with hot water of 80° C. for 20 seconds to obtain an aluminum plate as a support for a lithographic printing plate.

EXAMPLE 1

A photosensitive liquid comprising the following components, was coated by a wire bar on an aluminum support prepared by the above described method and dried at 85° C. for 2 minutes in an oven, followed by stabilizing in an oven of 55° C. to obtain a photosensitive lithographic printing plate.

Photosensitive liquid

| | |
|---|---|
| Alkali-soluble resin: novolak resin (Mw 7000) having phenol/m-cresol/p-cresol (20/50/30 molar ratio) cocondensed with formaldehyde | 100 parts by weight |
| IR-absorbing dye: compound of S-53 as identified above | 4 parts by weight |
| Lactone ring-containing dye compound: crystal violet lactone (by Tokyo Kasei Corporation) | 10 parts by weight |
| Crosslinking compound: Cymel 300 (by Mitsui Cytec Corporation) | 5 parts by weight |
| Solvent: cyclohexanone | 1,054 parts by weight |

The amount of film coating was 25 mg/$dm^2$.

Then, the above sample was subjected to image exposure of 212 lines/inch and from 3 to 97% halftone dot images with various exposure energies by means of a photosensitive lithographic printing plate exposure apparatus (Trend Setter 3244T, manufactured by Creo Products Inc.). Then, an alkaline developer (SDR-1, manufactured by Konica K.K.) was diluted 5 times, and development was carried out at 25° C. The resolution properties of 3% and 97% halftone dot images with various exposure energies, and the dissolution property at the non-image portion were visually evaluated. The results are shown in Table 1 (Plate making properties).

Then, in order to evaluate the strength in the exposed portion, the photosensitive lithographic printing plate prepared in the same manner was exposed and developed by the above-described method and heated for 6 minutes by an oven at a temperature of 200° C. (referred to as burning treatment for short), then impregnated for one minute in the Matsui washing oil (manufactured by Matsui Chemical Corporation). The film-remaining ratio of the image portion after impregnation was obtained from the respective reflection densities of the impregnated portion and the non-impregnated portion. Matsui washing oil used, was one type of plate cleaner for removing ink from the printing plate, and the chemical resistance to this, is an indicator for evaluation of the film-remaining ratio. Further, the remaining ratio of the 3% halftone dots was visually evaluated. As a comparison, a plate on which the heating at a temperature of 200° C. for 6 minutes (burning treatment) was not applied, was evaluated in the same manner. The results are shown in Table 1 (properties after impregnated in washing oil).

EXAMPLE 2

The same operation as in Example 1 was carried out except that the amount of Cymel 300 was changed to 10 parts by weight. The results are shown in Table 1.

COMPARATIVE EXAMPLE 1

The same operation with the same composition as in Example 1 was carried out except that cymel 300 was not used. The results are shown in Table 1.

TABLE 1

| | Amount of exposure | | Example 1 | Example 2 | Comparative Example 1 |
|---|---|---|---|---|---|
| Plate making properties | 200 mJ/$cm^2$ | 3% Halfdot | ○ | ○ | ○ |
| | | 97% Halfdot | ○ | ○ | ○ |
| | | Dissolution property | ○ | ○ | ○ |
| | 280 mJ/$cm^2$ | 3% Halfdot | ○ | ○ | ○ |
| | | 97% Halfdot | ○ | ○ | ○ |
| | | Dissolution property | ○ | ○ | ○ |
| | 400 mJ/$cm^2$ | 3% Halfdot | ○ | ○ | ○ |
| | | 97% Halfdot | ○ | ○ | ○ |
| | | Dissolution property | ○ | ○ | ○ |
| Properties after impregnation in washing oil | Without burning | Film-remaining ratio | 0% | 0% | 0% |
| | | 3% Halfdot | X | X | X |
| | With burning | Film-remaining ratio | 96% | 100% | 0% |
| | | 3% Halfdot | X | X | X |

Signed used in Table 1 are as follows:

With regard to plate making properties:

3% or 97% Halftone dot

○: Almost completely reproduced

Δ: Reproduced about 50 to 90%

×: Almost no image

Dissolution properties

○: No remaining film at non-image portion

Δ: Remaining film of less than 50% at non-image portion

×: Remaining film of 50% and more at non-image portion

Properties after impregnated in washing oil

Film-remaining ratio: The reflection densities of image portion after development, before and after impregnation, were measured by the reflection densitometer by Macbeth Corporation, and calculated by the following formula:

$$\text{Film-remainingratio (\%)} = \frac{A - C}{B - C} \times 100$$

A: Reflection density of image portion after impregnation
B: Reflection density of image portion without impregnation
C: Reflection density of non-image portion 3% Halftone dot ○: Almost completely remained Δ:50 to 90% of image remained ×: Less than 50 to almost no image remained As evident from Table 1, by adding the thermal crosslinking compound Cymel 300, chemical resistance to Matsui washing oil by burning treatment substantially improves. Further, it is confirmed that other performances such as resolution properties are good without adverse effects. This indicates that the strength in the image portion improves while a good image property is maintained. In other words, high printing resistance can be attained.

EXAMPLES 3 TO 8 AND COMPARATIVE EXAMPLE 2

The photosensitive liquid having the following composition was prepared, the same operation as in Example 1 was carried out to obtain the photosensitive lithographic printing plate.

| Composition | Parts by weight |
|---|---|
| Novolak having m-cresol/p-cresol (90/10 molar ratio) Mw 4000 | 100 |
| IR-absorbing dye Compound of S-53 as identified above | 4 |
| Crystal violet lactone (by Tokyo Kasei Corporation) | 10 |
| Crosslinking agent (described in Table 2) | 5 |
| Methylcellosolve | 1,054 |

The printing plate was treated in the same manner as in Example 1, and the chemical resistance after burning treatment was evaluated. The method and standard of the evaluation were the same as in Example 1.

In Comparative Example 2, the same photosensitive liquid as the above photosensitive liquid composition except that the crosslinking agent was not added, was used to prepare the photosensitive lithographic printing plate, and the evaluation was carried out in the same manner as described above. The results are shown in Table 2.

TABLE 2

| | Crosslinking agent *1 | Film-remaining ratio *2 |
|---|---|---|
| Example 3 | Cymel 300 (hexamethyl melamine, methoxylation ratio of over 95%, corresponding to the above structure (T-1-1)) | ◎ |
| Example 4 | Cymel 123 (methoxylation ratio of over 95%, corresponding to the above structure (T-2-1)) | ○ |
| Example 5 | N8101 (methoxylation ratio of over 95%, corresponding to the above structure (T-1-5)) | ◎ |
| Example 6 | N1311 (melamine type, the weight average molecular weight about 3,000) | ◎ |
| Example 7 | MW30HM (hexamethoxy melamine, methoxylation ratio of 95%, corresponding to the above structure (T-1-1)) | ◎ |
| Example 8 | UFR-65 (T-3-1, methoxylation ratio of over 95%) | ○ |
| Comparative Example 2 | none | X |

*1: Cymel 300, Cymel 1123, UFR-65:

Commercial products by Mitsui Cytec Corporation N8101, N1311, MW30HM: Commercial products by Sanwa Chemical Corporation Methoxylation rate is calculated from the peak ratio of NMR(H).

*2: Standard for evaluating the film-remaining ratio:

◎: 80% and more

○: From 50% to less than 80%

Δ: From 20% to less than 50%

×: Less than 20%

EXAMPLE 9

The same operation as in Example 1 was carried out except that the amount of cymel 300 was changed to 1 part by weight, to make a plate. The printing evaluation was carried out by means of Dia Printing device (manufactured by Mitsubishi Heavy Industries). The number of plates which were subjected to burning treatment (heated by an oven for 6 minutes at a temperature of 200° C.) was 50,000, and the 3% helfpoint dots on the printed plate maintained the same shape as at the initial stage.

Each of the lithographic printing plates used in Examples 1 to 9 was such that the solubility in the alkali developer did not substantially change even when left to stand for 10 hours under irradiation with a light intensity of 400 lux under a white lamp.

The positive photosensitive composition of the present invention provides the photosensitive lithographic printing plate wherein the contrast as between an image portion and a non-image portion is excellent, the film-remaining ratio in the image portion is sufficient, and the strength of the image portion is excellent and the printing resistance is substantially improved by burning treatment. Particularly, the photosensitive lithographic printing plate of the present invention can be advantageously used for plate making treatment in which heat treatment is conducted

What is claimed is:

1. A positive photosensitive lithographic printing plate for an alkali developer, which comprises a support and a photosensitive layer made of a positive photosensitive composition formed thereon, said positive photosensitive composition consisting essentially of (a) an alkali-soluble resin and (b) a photo-thermal conversion material, and (c) a compound capable of crosslinking the alkali-soluble resin by a thermal action.

2. The positive photosensitive lithographic printing plate according to claim 1, wherein the photo-thermal conversion material is a compound which has an absorption band covering a part or whole of a wavelength region of from 650 to 1,300 nm, and which generates heat upon optical exposure to a part or whole of a wavelength region of from 650 to 1,300 nm.

3. The positive photosensitive lithographic printing plate according to claim 1, wherein the above compound (c) is a nitrogen-containing compound.

4. The positive photosensitive lithographic printing plate according to claim 3, wherein the above compound (c) is a compound having an amino group.

5. The positive photosensitive lithographic printing plate according to claim 4, wherein the compound having an amino group is an amino compound having at least two methylol groups or alkoxymethyl groups.

6. The positive photosensitive lithographic printing plate according to claim 4, wherein the compound having an amino group has a heterocyclic structure.

7. The positive photosensitive lithographic printing plate according to claim 1, wherein the above compound (c) is a compound having at least two groups of the structure represented by the following formula (T) in the molecule.

(T)

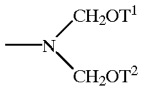

wherein each of $T^1$ and $T^2$ which are independent of each other, is a hydrogen atom, an alkyl group, an alkenyl group or an acyl group.

8. The positive photosensitive lithographic printing plate according to claim 1, wherein the above compound (c) is a melamine derivative.

9. The positive photosensitive lithographic printing plate according to claim 8, wherein the melamine derivative is a compound of the following formula (T-1) and/or a compound wherein structures of the formula (T-1) are condensed by means of a bivalent connecting group.

(T-1)

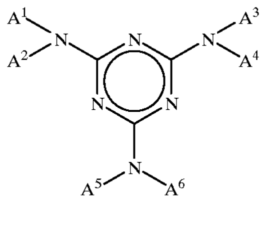

wherein each of $A^1$–$A^6$ which are independent of one another, is a group of —$CH_2OU$, wherein U is a hydrogen atom, an alkyl group, an alkenyl group or an acyl group.

10. The positive photosensitive lithographic printing plate according to claim 9, wherein U is a hydrogen atom or a $C_{1-4}$ alkyl group, and the alkoxylation ratio is at least 70% (molar ratio).

11. The positive photosensitive lithographic printing plate according to claim 1, which further contains at least a compound (d) capable of suppressing the alkali solubility of a mixture of (a) and (b).

12. The positive photosensitive lithographic printing plate of claim 11, wherein said compound (d) is at least one compound selected from the group consisting of carboxylic acid esters, sulfonic acid esters, lactone-ring containing dyes, and mixtures thereof.

13. The positive photosensitive lithographic printing plate according to claim 1, which has a characteristic such that a difference in solubility in an alkali developer as between an exposed portion and a non-exposed portion, is created mainly by a change other than a chemical change.

14. A method for treating a positive photosensitive lithographic printing plate, which comprises exposing the positive photosensitive lithographic printing plate as defined in claim 1, by a light having a wavelength of from 650 to 1,300 nm.

15. A method for treating a positive photosensitive lithographic printing plate, which comprises exposing the positive photosensitive lithographic printing plate as defined in claim 1, by a laser beam having a wavelength of from 650 to 1,300 nm.

16. A method for treating a positive photosensitive lithographic printing plate, which comprises developing the positive photosensitive lithographic printing plate as defined in claim 1, without heat treatment during the period of after exposure and before development.

17. The method for treating a positive photosensitive lithographic printing plate according to claim 16, wherein heating is carried out after the development.

18. The method for treating the positive photosensitive lithographic printing plate according to claim 17, wherein the heating temperature is from 150 to 300° C.

19. The method for treating a positive photosensitive lithographic printing plate according to claim 17, wherein the heating temperature is from 180 to 230° C.

20. The method for treating a positive photosensitive lithographic printing plate of claim 1, which comprises exposing the positive photosensitive lithographic printing plate to a laser beam having a wavelength of from 650 to 1,300 nm, developing the positive photosensitive lithographic printing plate with an alkali developer without heat treatment, and heating the positive photosensitive lithographic printing plate at a temperature of from 150 to 300° C. after development.

21. A positive photosensitive lithographic printing plate consisting essentially of (a) an alkali-soluble resin and (b) a photo-thermal conversion material, which further contains (c) a compound capable of crosslinking the alkali-soluble resin by a thermal action.

* * * * *